(12) United States Patent
Yamauchi et al.

(10) Patent No.: US 9,384,797 B2
(45) Date of Patent: Jul. 5, 2016

(54) MEMORY CONTROL METHOD AND SYSTEM

(71) Applicant: FUJITSU LIMITED, Kawasaki-shi, Kanagawa (JP)

(72) Inventors: Hiromasa Yamauchi, Kawasaki (JP); Koichiro Yamashita, Hachioji (JP); Takahisa Suzuki, Kawasaki (JP); Koji Kurihara, Kawasaki (JP); Toshiya Otomo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 349 days.

(21) Appl. No.: 13/949,923

(22) Filed: Jul. 24, 2013

(65) Prior Publication Data

US 2013/0311727 A1 Nov. 21, 2013

Related U.S. Application Data

(63) Continuation of application No. PCT/JP2011/051354, filed on Jan. 25, 2011.

(51) Int. Cl.
| | | |
|---|---|---|
| G06F 12/00 | (2006.01) |
| G11C 7/10 | (2006.01) |
| G06F 12/10 | (2016.01) |
| G06F 12/02 | (2006.01) |
| G06F 12/08 | (2016.01) |
| G06F 9/445 | (2006.01) |

(52) U.S. Cl.
CPC .......... *G11C 7/1075* (2013.01); *G06F 12/0284* (2013.01); *G06F 12/08* (2013.01); *G06F 12/10* (2013.01); *G06F 12/1009* (2013.01); *G06F 12/1018* (2013.01); *G06F 9/445* (2013.01); *G06F 2212/1016* (2013.01)

(58) Field of Classification Search
CPC . G06F 12/0284; G06F 12/10; G06F 12/1027; G06F 12/1009; G06F 12/1018; G11C 7/1075
See application file for complete search history.

(56) References Cited

U.S. PATENT DOCUMENTS

| 7,548,924 B2* | 6/2009 | Watanabe ............. G06F 3/0605 |
| 2006/0155927 A1* | 7/2006 | Sawitzki ................... G06F 5/10 |
| | | 711/109 |
| 2008/0235448 A1* | 9/2008 | Inoue ...................... G06F 3/061 |
| | | 711/114 |

(Continued)

FOREIGN PATENT DOCUMENTS

| JP | 11-194954 A | 7/1999 |
| JP | 2003-84991 A | 3/2003 |

(Continued)

OTHER PUBLICATIONS

Japanese Office Action issued in JP 2012-554532, mailed Mar. 11, 2014, with a Partial English translation, 5 pages.
International Search Report issued in PCT/JP2011/051354, mailed Mar. 1, 2011, 2 pages.

*Primary Examiner* — Aracelis Ruiz
(74) *Attorney, Agent, or Firm* — Arent Fox LLP

(57) ABSTRACT

A memory control method includes assigning based on a table to which an allocated device that executes a first process in a first application is registered, the first process in the first application to the allocated device registered; notifying a port connector of identification information of a port of memory, the port to be used by the first application, and registering a number of the port into the table; and allocating a storage area to the port and registering an address of the storage area into the table.

13 Claims, 19 Drawing Sheets

(56) References Cited

U.S. PATENT DOCUMENTS

| | | | |
|---|---|---|---|
| 2009/0083457 A1* | 3/2009 | Kim | G06F 13/1657 710/56 |
| 2010/0169889 A1* | 7/2010 | Tsuji | G06F 9/3828 718/102 |
| 2011/0193988 A1 | 8/2011 | Hatano | |

FOREIGN PATENT DOCUMENTS

| | | |
|---|---|---|
| JP | 2006-350622 A | 12/2006 |
| JP | 2010-097311 A | 4/2010 |
| JP | 2010-152733 A | 7/2010 |
| WO | WO 2010/044175 A1 | 4/2010 |

* cited by examiner

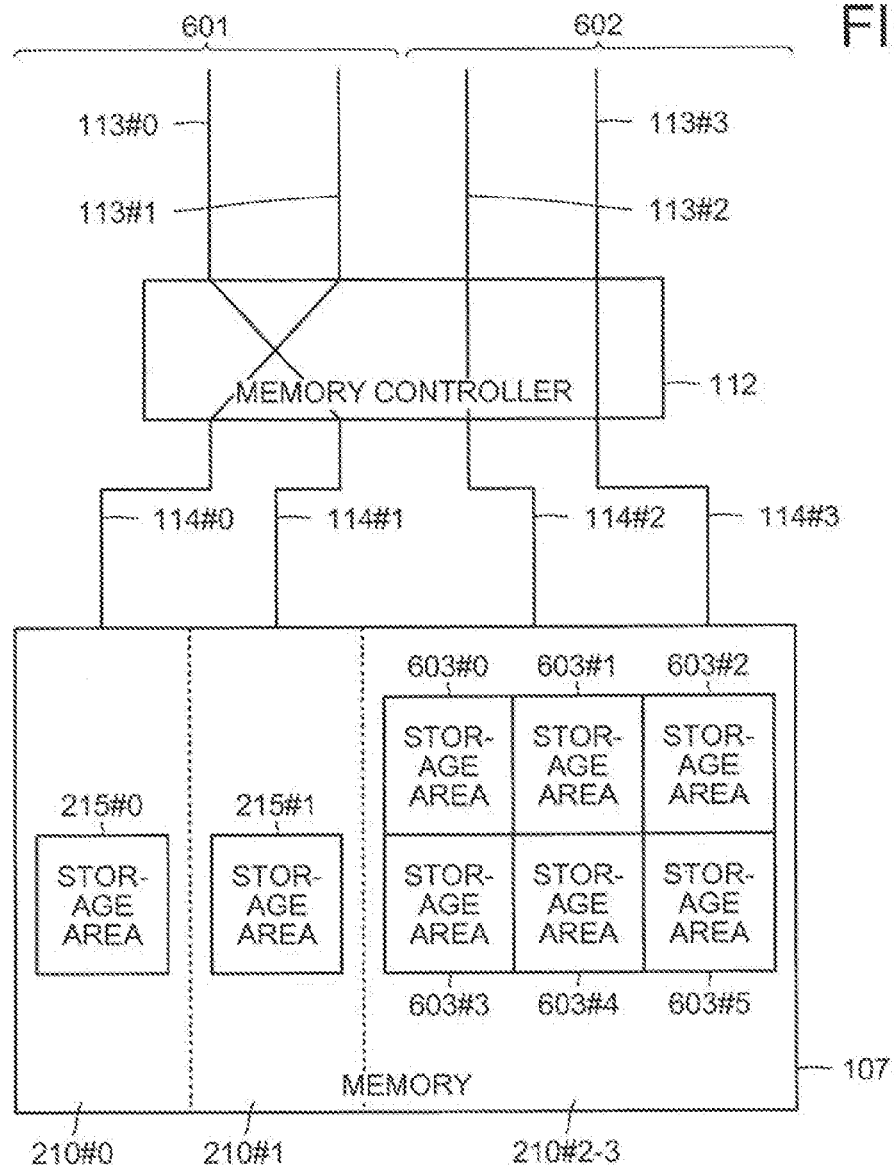

FIG.7

APP #0
    PROCESS EXECUTION INFORMATION
        SCENARIO INFORMATION: PRESENT       701#0

| SEQUENCE | PROCESS | ALLOCATED DEVICE |
|---|---|---|
| 1 | funcA | DBB 104 |
| 2 | funcB | CPUs 105 |
| 3 | funcC | GPU 106 |
| 4 | funcD | CPUs 105 |
| 5 | funcE | LCDC 201 |

UTILIZED PORT: 113#0
    HEAD PHYSICAL ADDRESS: 0x0180

APP #1
    PROCESS EXECUTION INFORMATION
        SCENARIO INFORMATION: PRESENT       701#1

| SEQUENCE | PROCESS | ALLOCATED DEVICE |
|---|---|---|
| 1 | funcF | CPUs 105 |
| 2 | funcG | GPU 106 |
| 3 | funcH | CPUs 105 |
| 4 | funcI | LCDC 201 |

UTILIZED PORT: 113#1
    HEAD PHYSICAL ADDRESS: 0x00a0

APP #2
    PROCESS EXECUTION INFORMATION
        SCENARIO INFORMATION: PRESENT       701#2

| SEQUENCE | PROCESS | ALLOCATED DEVICE |
|---|---|---|
| 1 | funcJ | CPUs 105 |
| : | : | : |
| n | funcK | LCDC 201 |

UTILIZED PORT:
    HEAD PHYSICAL ADDRESS:

...

APP #N
    PROCESS EXECUTION INFORMATION
        SCENARIO INFORMATION: NONE
        UTILIZED PORT:
        HEAD PHYSICAL ADDRESS:

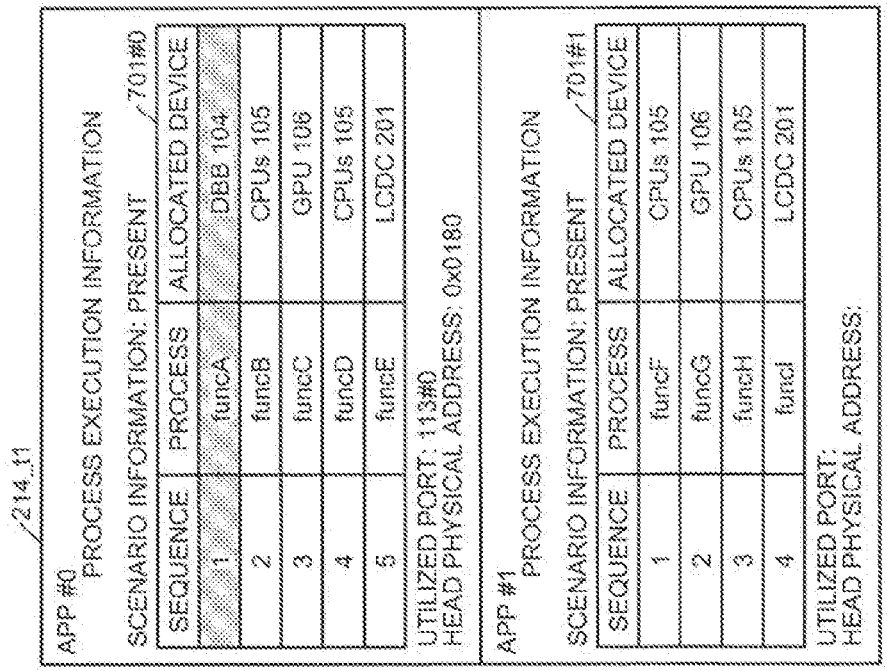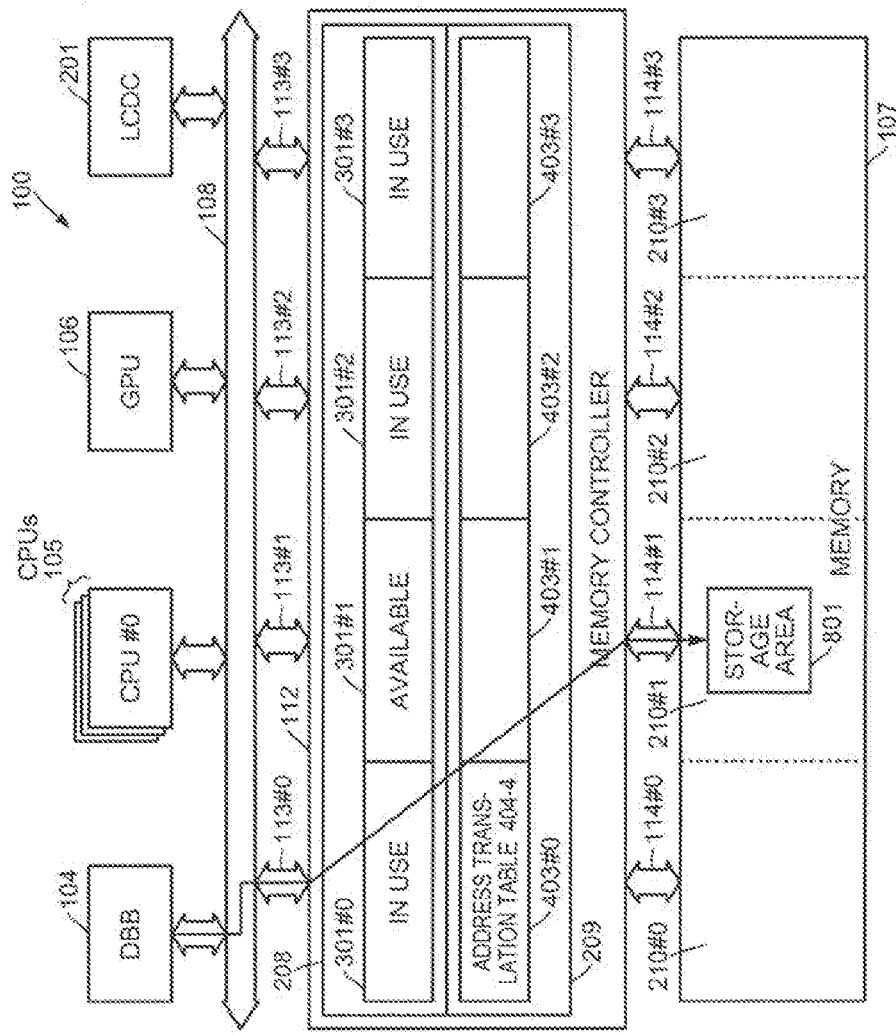
FIG.8

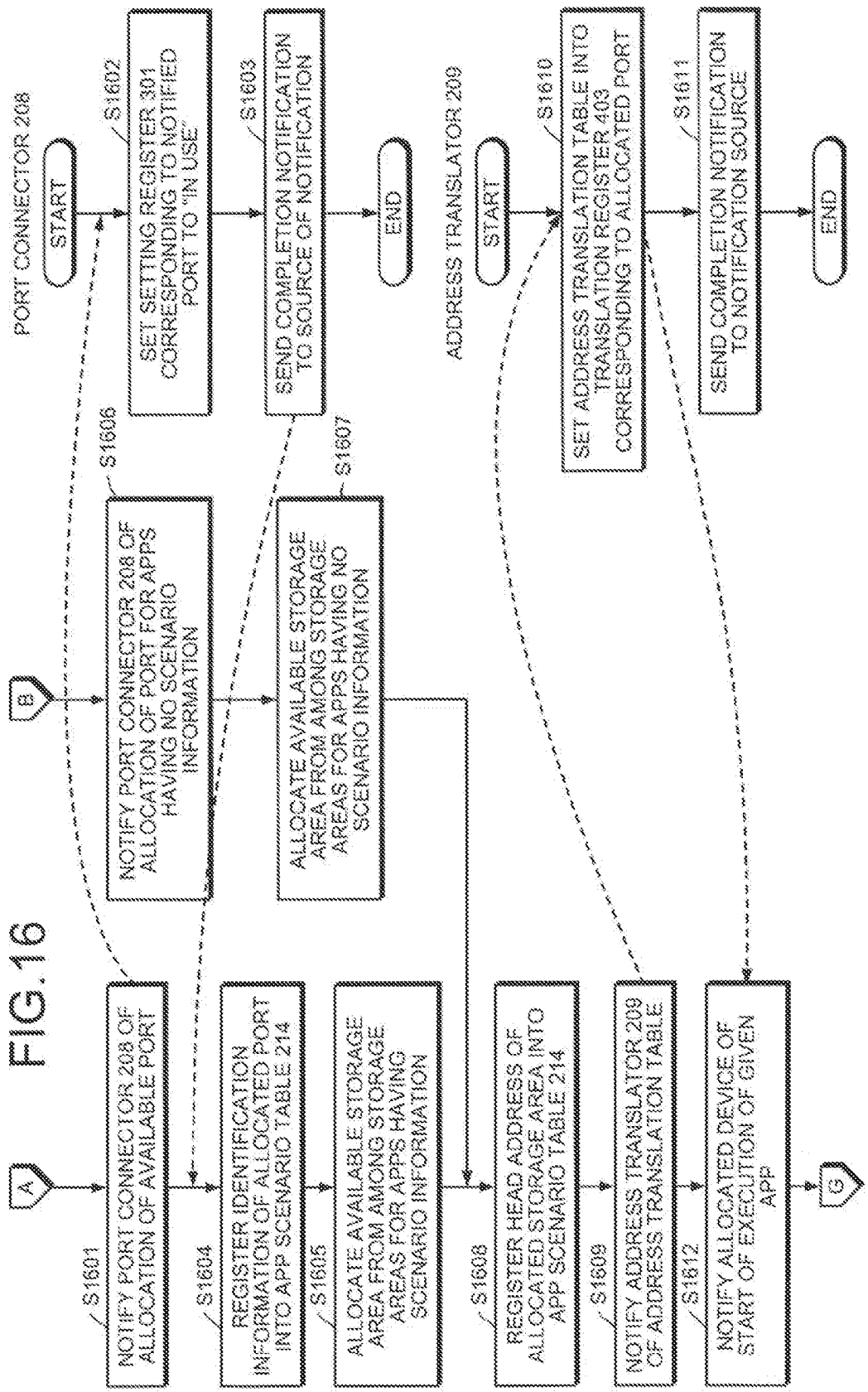

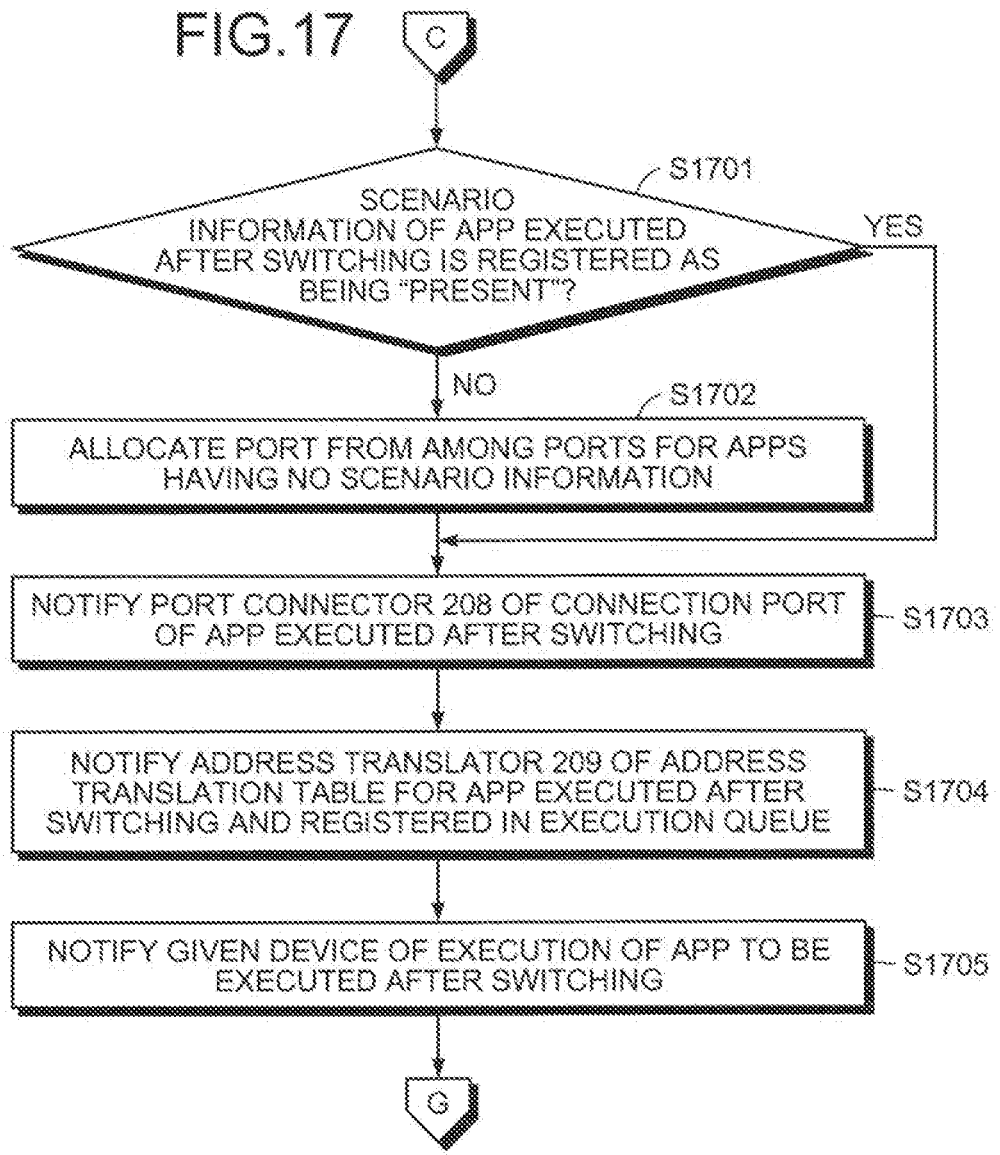

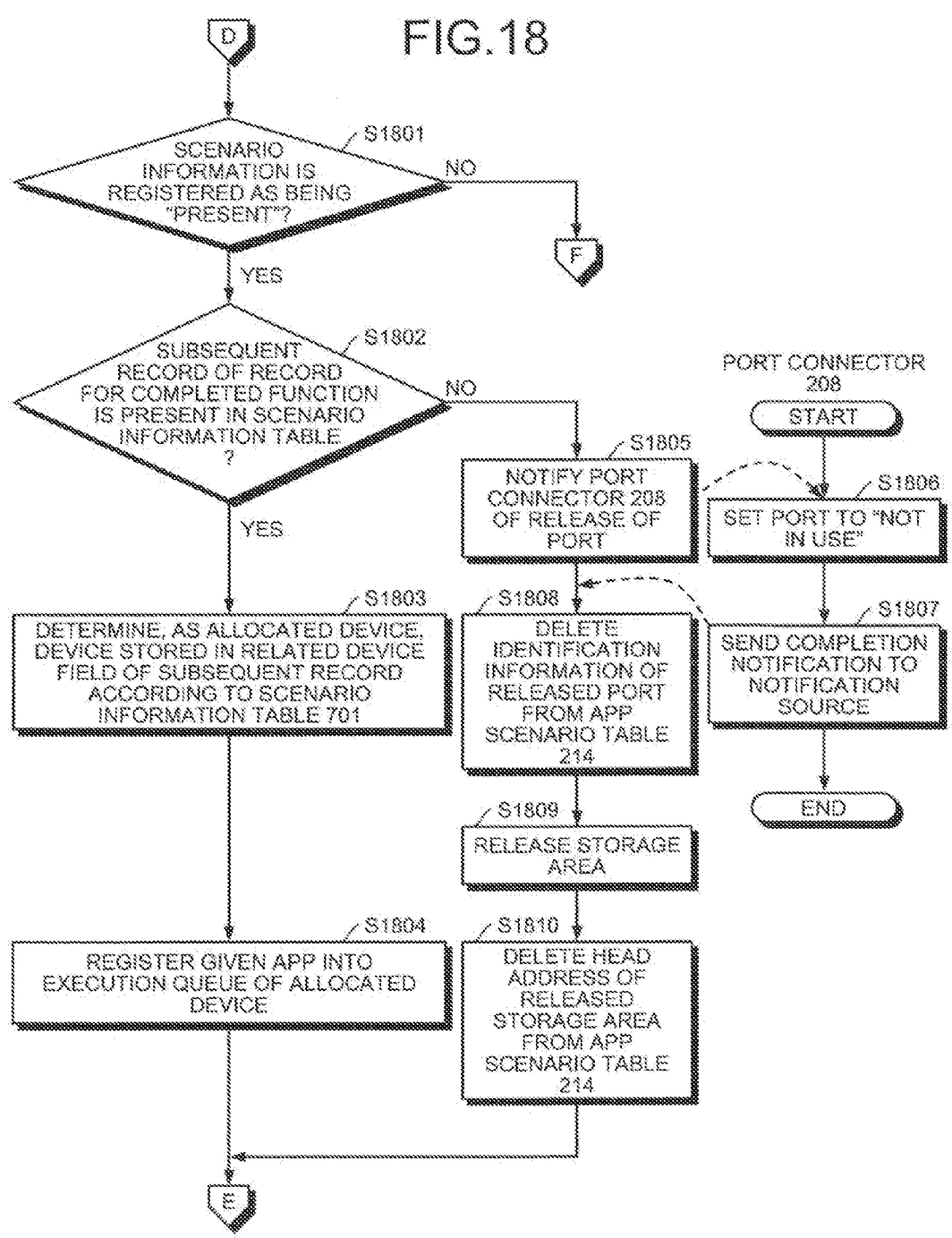

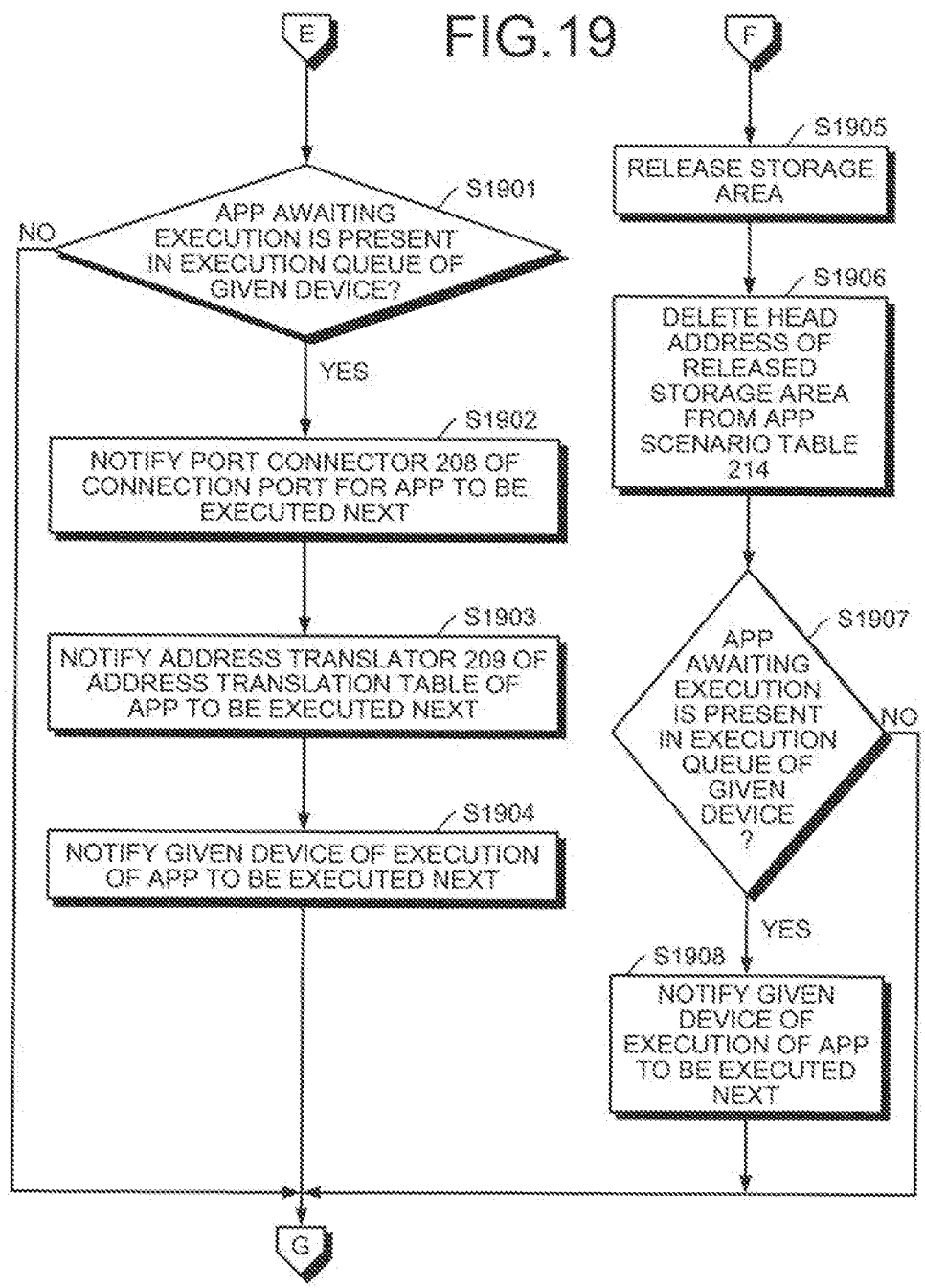

US 9,384,797 B2

MEMORY CONTROL METHOD AND SYSTEM

CROSS REFERENCE TO RELATED APPLICATIONS

This application is a continuation application of International Application PCT/JP2011/051354, filed on Jan. 25, 2011 and designating the U.S., the entire contents of which are incorporated herein by reference.

FIELD

The embodiments discussed herein are related to a memory control method and system that control memory access.

BACKGROUND

Conventionally, a computer system is equipped with various devices each making access to a main memory. For example, a cellular phone is equipped with a central processing unit (CPU), a digital baseband processor (DBB), a graphics processing unit (GPU), and a liquid crystal display controller (LCDC). Application software (hereinafter, "app") run on a computer system jointly operates with the devices such as the CPU, DBB, GPU, and LCDC, to provide a service to the user.

Joint operations will be described. The computer system first stores into memory, data acquired by the DBB through a communication network. The CPU next subjects the acquired data to preprocessing for a codec process. The GPU then subjects the preprocessed data to the codec process. The CPU subjects the codec-processed data to post-processing for the codec process. Finally, the LCDC reads in the post-processed data for output to a liquid crystal display (LCD). In this manner, the computer system allows these devices to jointly operate in a pipeline manner, to achieve an improved throughput.

However, consequent to concurrent access of the main memory by the devices as a result of the joint operation, access contention may occur. The occurrence of access contention causes one of the devices attempting to access the main memory to have to wait, resulting in reduced throughput. Disclosed as a technology that prevents access contention is a technology that has an equal number of memory devices to that of the devices, each memory having an equal number of memory controllers to that of the devices (see, e.g., Japanese Laid-Open Patent Publication No. 2010-97311).

Among the described prior arts, the technology of Japanese Laid-Open Patent Publication No. 2010-97311 in particular has a problem in that due to the need for memory devices and memory controllers equivalent in number to that of the devices, the circuit scale becomes large, leading to increased production cost.

SUMMARY

According to an aspect of an embodiment, a memory control method includes assigning based on a table to which an allocated device that executes a first process in a first application is registered, the first process in the first application to the allocated device registered; notifying a port connector of identification information of a port of memory, the port to be used by the first application, and registering a number of the port into the table; and allocating a storage area to the port and registering an address of the storage area into the table.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is an explanatory view of a setting example of ports 113 and 114 and a memory block 210;

FIG. 7 is an explanatory view of an example of the storage contents of an app scenario table 214;

FIG. 8 is an explanatory view of the state at time t1 in the multi-core processor system 100 according to operations in the app scenario table 214;

FIG. 16 is a flowchart (2) of the memory control process;

FIG. 17 is a flowchart (3) of the memory control process;

FIG. 18 is a flowchart (4) of the memory control process; and

FIG. 19 is a flowchart (5) of the memory control process.

DESCRIPTION OF EMBODIMENTS

With reference to the accompanying drawings, an embodiment of a memory control method and system disclosed herein will be described in detail. A multi-core processing system having plural CPUs will be described as an example of a system executing the memory control method of the embodiment. The multi-core processor is a processor having plural cores. Provided that the multi-core processor has plural cores, the multi-core processor may be a single processor equipped with plural cores or a group of single-core processors arranged in parallel. In the present embodiment, for the simplification of description, description will be given taking a group of single-core processors arranged in parallel as an example. The system executing the memory control method may be a single-core processor system having a single core.

Figure 1:
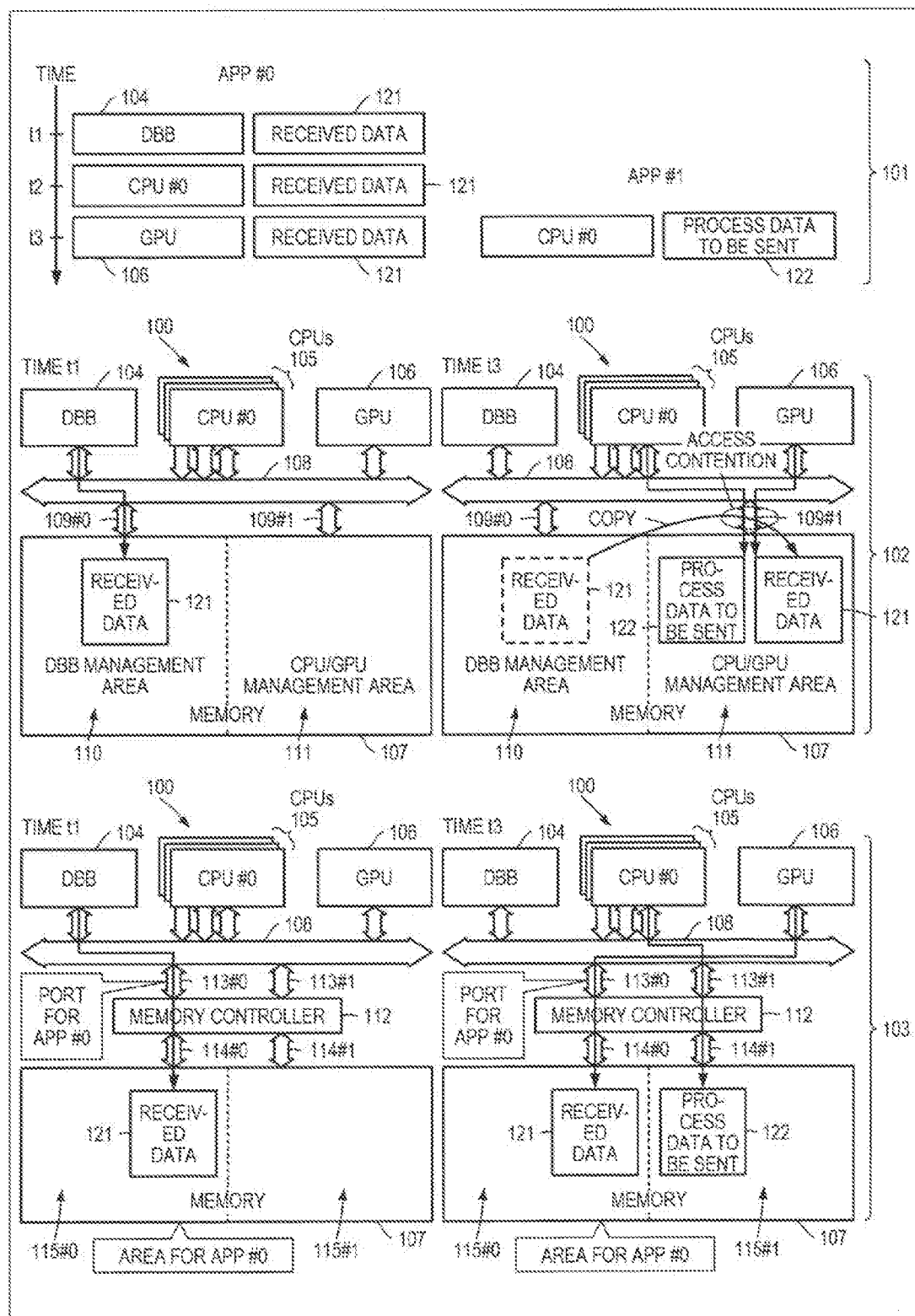
FIG. 1 is an explanatory view of joint operation in a multi-core processor system 100.

FIG. 1 is an explanatory view of joint operation in a multi-core processor system 100. An explanatory view designated by reference numeral 101 is a diagram depicting the state of joint operation at a given time. An explanatory view designated by reference numeral 102 is an explanatory view depicting the state at time t1 and time t3 during the joint operation in the multi-core processor system 100 of the prior art example. An explanatory view designated by reference numeral 103 is an explanatory view depicting the state at time t1 and time t3 during the joint operation in the multi-core processor system 100 of the present embodiment.

In the explanatory view designated by reference numeral 101, apps are assumed to include an app #0 and an app #1 that operate jointly. For example, the app #0 processes data 121 received by a DBB 104 from a network and the app #1 processes data 122 to be sent to the DBB 104 from a CPU #0 among CPUs 105. Provided that software performs an inter-device joint operation, the software may be software other than the application software. For example, provided that inter-device cooperative processing is present, the memory control method of the present embodiment is applicable to basic software such as an operating system (OS) as well.

In the app #0, at time t1, the DBB 104 starts the processing of the data 121 received from the network. At time t2, the CPU #0 subjects the received data 121 to preprocessing for a codec decoding process. At time t3, the GPU 106 performs the codec process. Subsequently, post-processing for the codec decoding process and a display process are performed, but in the explanatory view designated by reference numeral 101, the subsequent processes are not indicated. At time 3, the CPU #0 generates the data 122 to be sent. Subsequently, a codec encoding process, post-processing for the codec process, and a transmission process are performed, but in the explanatory view designated by reference numeral 101 the subsequent processes are not indicated.

In the explanatory view designated by reference numeral 102, the multi-core processor system 100 of the prior art example includes the DBB 104, the CPUs 105 including plural CPUs, the GPU 106, and memory 107. The components are connected via a bus 108. The DBB 104, the CPUs 105, and the GPU 106 are defined as devices that access the memory. For example, the devices include a digital signal processor (DSP).

A port 109#0 and a port 109#1 are I/O ports to/from the memory 107. The memory 107 includes a DBB management area 110 that is a storage area managed by the DBB 104 and a CPU/GPU management area 111 that is a storage area managed by the CPUs 105 and the GPU 106. When a given device accesses the DBB management area 110, the given device accesses the DBB management area 110 via the port 109#0. Similarly, when a given device accesses the CPU/GPU management area 111, the given device accesses the CPU/GPU management area 111 via the port 109#1.

At time t1, the DBB 104 writes into the DBB management area 110, the data 121 received via the port 109#0. Next, at time t2, the CPU #0 copies the received data 121 onto the CPU/GPU management area 111 and thereafter executes the preprocessing on the received data 121. Then, at time t3, the GPU 106 executes the codec decoding process on the received data 121. Simultaneously, at time t3, the CPU #0 generates data 122 to be sent. At time t3, access contention occurs consequent to simultaneous access of the port 109#1 by the CPU #0 and the GPU 106.

In the explanatory view designated by reference numeral 103, the multi-core processor system 100 of the present embodiment includes the DBB 104, the CPUs 105, the GPU 106, and the memory 107. The components are connected via the bus 108.

The multi-core processor system 100 of the present embodiment includes a memory controller 112 intervening between the memory 107 and the bus 108. Ports 113#0 and 113#1 exist as I/O ports between the bus 108 and the memory controller 112 and ports 114#0 and 114#1 exist as I/O ports between the memory controller 112 and the memory 107. The memory 107 includes a storage area 115#0 accessed via the port 113#0 and a storage area 115#1 accessed via the port 113#1. In the multi-core processor system 100 of the present embodiment, the port 113#0 is set at a port for app #0 and the storage area 115#0 is set at an area for app #0.

At time t1, the DBB 104 writes the received data 121 into the storage area 115 #0 set in the area for app #0, via the port 113#0 and the port 114#0 set at the port for app #0. Next, at time t2, the CPU #0 does not copy the received data 121 in the storage area 115#0 but rather executes preprocessing for the received data 121 in the storage area 115#0. Then, at time t3, the GPU 106 executes in the storage area 115#0 and via the port 113#0 and the port 114#0, the codec decoding process for the received data 121. At the same time, at time t3 and in the storage area 115#1, which is not an area for app #0, the CPU #0 generates via the port 113#1 and the port 114#1, which are not ports for app #0, the data 122 that is to be sent.

In this manner, the multi-core processor system 100 of the present embodiment has memory management areas separated for each app so that no copies occur between storage areas to prevent copying between the storage areas. The multi-core processor system 100 of the present embodiment sets a port used by a specific app so that the same port cannot be accessed by a device executing a different app, thereby enabling the multi-core processor system 100 of the present embodiment to prevent access contention at the memory.

In the following description, if the multi-core processor system 100 is not particularly specified, the description will be given with respect to the multi-core processor system 100 of the present embodiment.

Figure 2:
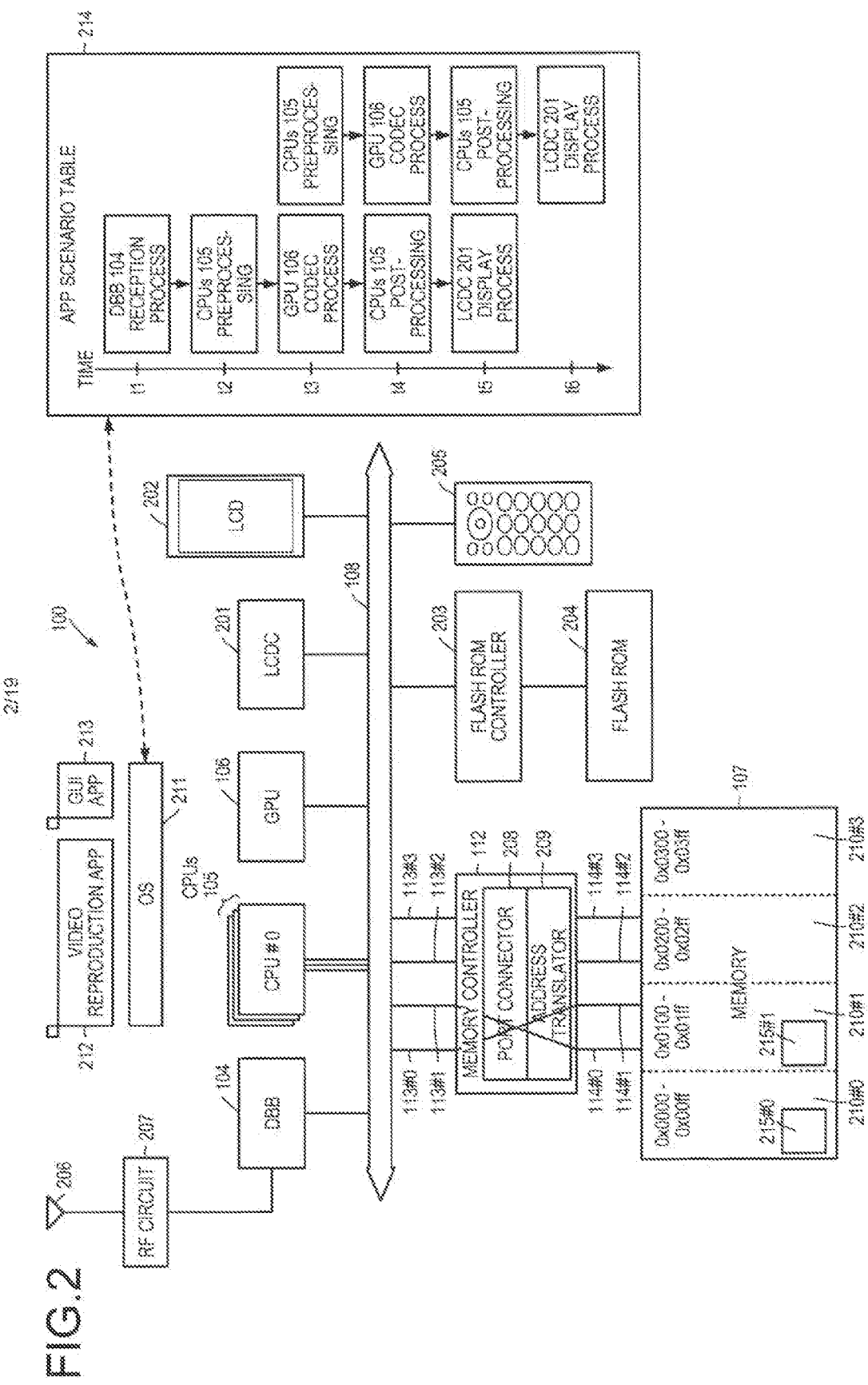
FIG. 2 is a block diagram of hardware and software of the multi-core processor system 100 of an embodiment.

FIG. 2 is a block diagram of hardware and software of the multi-core processor system 100 of the present embodiment. In FIG. 2, the hardware of the multi-core processor system 100 includes the DBB 104, the CPUs 105, the GPU 106, an LCDC 201, an LCD 202, a flash ROM controller 203, flash ROM 204, and a keyboard 205, respectively connected via the bus 108.

The multi-core processor system 100 further includes the memory 107. The memory 107 is connected via the memory controller 112 to the bus 108. The bus 108 and the memory controller 112 are connected to each other by way of ports 113#0 to 113#3 and the memory controller 112 and the memory 107 are connected to each other by way of ports 114#0 to 114#3. The multi-core processor system 100 further includes an antenna 206 and a radio frequency (RF) circuit 207. The RF circuit 207 is connected to the DBB 104 while the antenna 206 is connected to the RF circuit 207.

The DBB 104 is a processor that detects telephone communication by a notice from the RF circuit and that handles communication and telephone communication. The CPUs 105 provide overall control of the multi-core processor system 100. The CPUs 105 include CPUs #0 to #2. The CPUs 105 may include one or more CPUs. The CPUs #0 to #2 may have a dedicated cache memory. The GPU 106 performs a codec process for graphics processing. The LCDC 201 controls the LCD 202 to allow a display of image data or video data. For example, the LCDC 201 reads video random access memory (VRAM) and performs display on the LCD 202.

The memory 107 is a main storage device or an auxiliary storage device. For example, the memory 107 is a storage device such as read-only memory (ROM), random access memory (RAM), and flash ROM. The ROM stores a boot program and/or other programs. The RAM is used as a work area for the CPUs 105. The flash ROM stores an OS, other system software and/or an execution object such as application software.

The memory 107 is divided into memory blocks 210#0 to 210#3 that are physical address spaces segmented for each of the ports 114#0 to 114#3. The memory blocks 210#0 to 210#3 may be a continuous physical address space or discontinuous physical address spaces. The memory 107 may exist as a single memory bank or each memory block may exist as a single memory bank.

The physical address range of the memory block 210#0 is 0x0000 to 0x00ff. Similarly, the physical address range of the memory block 210#1 is 0x0100 to 0x01ff. The physical address range of the memory block 210#2 is 0x0200 to 0x02ff. The physical address range of the memory block 210#3 is 0x0300 to 0x03ff.

The memory controller 112 has a function of controlling the reading and writing of data with respect to the memory 107. The memory controller 112 of the present embodiment alters the settings of the ports 113#0 to 113#3 and the ports 114#0 to 114#3 for accessing the memory 107, to thereby control access of the memory 107 by the devices.

The memory controller 112 includes internally, a port connector 208 and an address translator 209. The port connector 208 is in the interior of the memory controller 112 to connect and disconnect the ports 113#0 to 113#3. In the example of FIG. 2, the port connector 208 sets the ports 113#2 and 113#3 to non-connection. A setting example of the port connector 208 will be described later with reference to FIG. 3.

The address translator 209 is in the interior of the memory controller 112 to perform address translation of the ports 113#0 to 113#3. A conversion example of the address translator 209 will be described later with reference to FIG. 4.

The LCD 202 displays data such as documents, images and functional information as well as a cursor, an icon, and a toolbox. For example, the LCD 202 may be a thin film transistor (TFT) liquid crystal display.

The flash ROM controller 203 controls to the reading and writing of data with respect to the flash ROM 204 under the control of the CPUs 105. The flash ROM 204 stores data written thereto under the control of the flash ROM controller 203. Data to be stored can be, for example, image data and video data acquired by the user of the multi-core processor system 100 via the antenna 206 or a program executing a memory control method of the present embodiment. The flash ROM 204 can be, for example, a memory card or an SD card.

The keyboard 205 has keys for the input of numerals, various instructions, etc., to perform data entry. The keyboard 205 may be a touch-panel-type input pad or a ten-key pad.

The antenna 206 transmits and receives radio signals. The RF circuit 207 is a high-frequency processing unit for the reception and transmission of data with respect to a network such as Internet, via the antenna 206. As used herein, the RF circuit 207 includes an analog-to-digital (A/D) converter or a D/A converter to convert data from the antenna 206 to a digital signal or to convert data from the DBB 104 to an analog signal.

Software run on the multi-core processor system 100 includes an OS 211, a video reproduction app 212, and a graphical user interface (GUI) app 213. The storage area of the multi-core processor system 100 stores an app scenario table 214.

The OS 211 is a program that controls the multi-core processor system 100. For example, the OS 211 performs scheduling processing of an app run on the CPUs #0 to #2. The OS 211 provides a library used by the app. The video reproduction app 212 is software that reproduces streaming video acquired via the antenna 206, etc. by the user or video data stored in the flash ROM 204. The GUI app 213 is software that displays selectable items in the form of icons or menus on the LCD 202 to enable the selection of an item by the user through operation of the keyboard 205, thereby enabling the operation of the multi-core processor system 100.

The app scenario table 214 is a table that stores, for each software, devices accessing the memory 107, processes executed by the devices, and the sequence of execution of the processes. As an example, a case is assumed where the video reproduction app 212 receives a streaming video reproduction request at time t1 and the GUI app 213 receives a still image preview display request at time t3.

In this case, according to the app scenario table 214, the video reproduction app 212 executes a reception process by the DBB 104 at time t1, executes preprocessing by one of the CPUs 105 at time t2, and executes the codec process by the GPU 106 at time t3. The video reproduction app 212 further executes post-processing by one of the CPUs 105 at time t4 and executes the display process by the LCDC 201 at time t5. During the time t1 to time t5, the video reproduction app 212 accesses a storage area 215#1 in the memory block 210#1 by way of the ports 113#0 and 114#1.

All data handled by the video reproduction app 212 is stored in an auxiliary storage device such as the flash ROM 204 by a file system and a portion of all the data is arranged in the memory 107 by a function of the OS 211. Accordingly, the storage area 215#1 does not extend beyond the memory block 210#1.

According to the app scenario table 214, the GUI app 213 executes preprocessing by one of the CPUs 105 at time t3 and executes codec process by the GPU 106 at time t4. The GUI app 213 further executes post-processing by one of the CPUs 105 at time t5 and executes the display process by the LCDC 201 at time t6. During the time t3 to time t6, the GUI app 213 accesses a storage area 215#0 in the memory block 210#0 by way of the ports 113#1 and 114#0.

Figure 3:
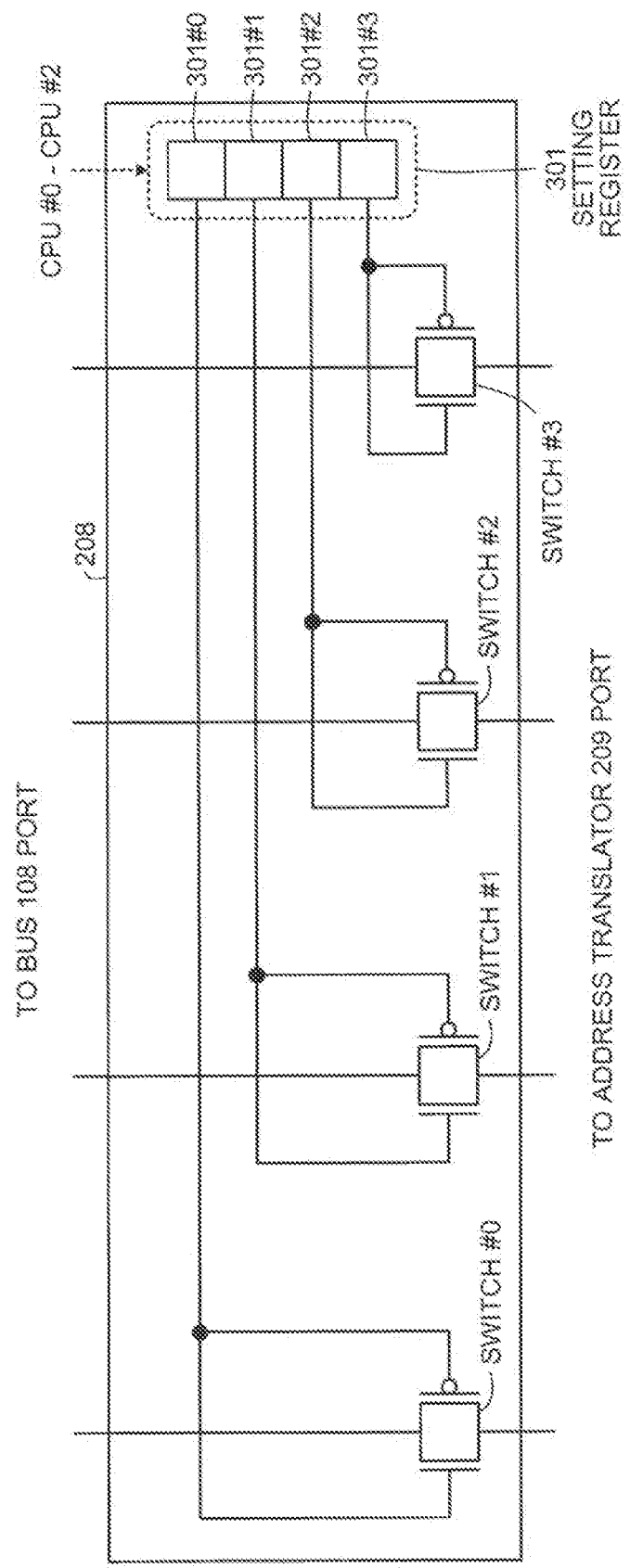
FIG. 3 is an explanatory view of the interior of a port connector 208.

FIG. 3 is an explanatory view of the interior of the port connector 208. The port connector 208 is included in the memory controller 112 and intervenes between the bus 108 and the address translator 209 to control connection and non-connection of the ports 113#0 to 113#3 and the ports 114#0 to 114#3. The connection and non-connection of the ports 113#0 to 113#3 and the ports 114#0 to 114#3 are controlled by a setting register 301 accessed by the CPUs #0 to #2. The setting register 301 includes setting registers 301#0 to 301#3 that control the connection and non-connection of the ports 113#0 to 113#3 and the ports 114#0 to 114#3.

For example, the setting register 301#0 controls a switch #0 to set the connection and non-connection of the port 113#0. The setting register 301#0 sets the ports 113#0 and 114#0 to connection if the set value indicates "in use", whereas the setting register 301#0 sets the ports 113#0 and 114#0 to non-connection if the set value indicates "available". The same applies to the other setting registers 301. The setting registers 301#1 to 301#3 perform the connection and non-connection of the ports 113#1 to 113#3 and the ports 114#1 to 114#3, respectively. A connected port is a port being used by a given app. A non-connected port becomes available and consequently, no electric power is supplied to connections in the port. As a result, a power saving effect can be obtained by setting a port to a non-connected state if use of the port is unnecessary.

Figure 4:
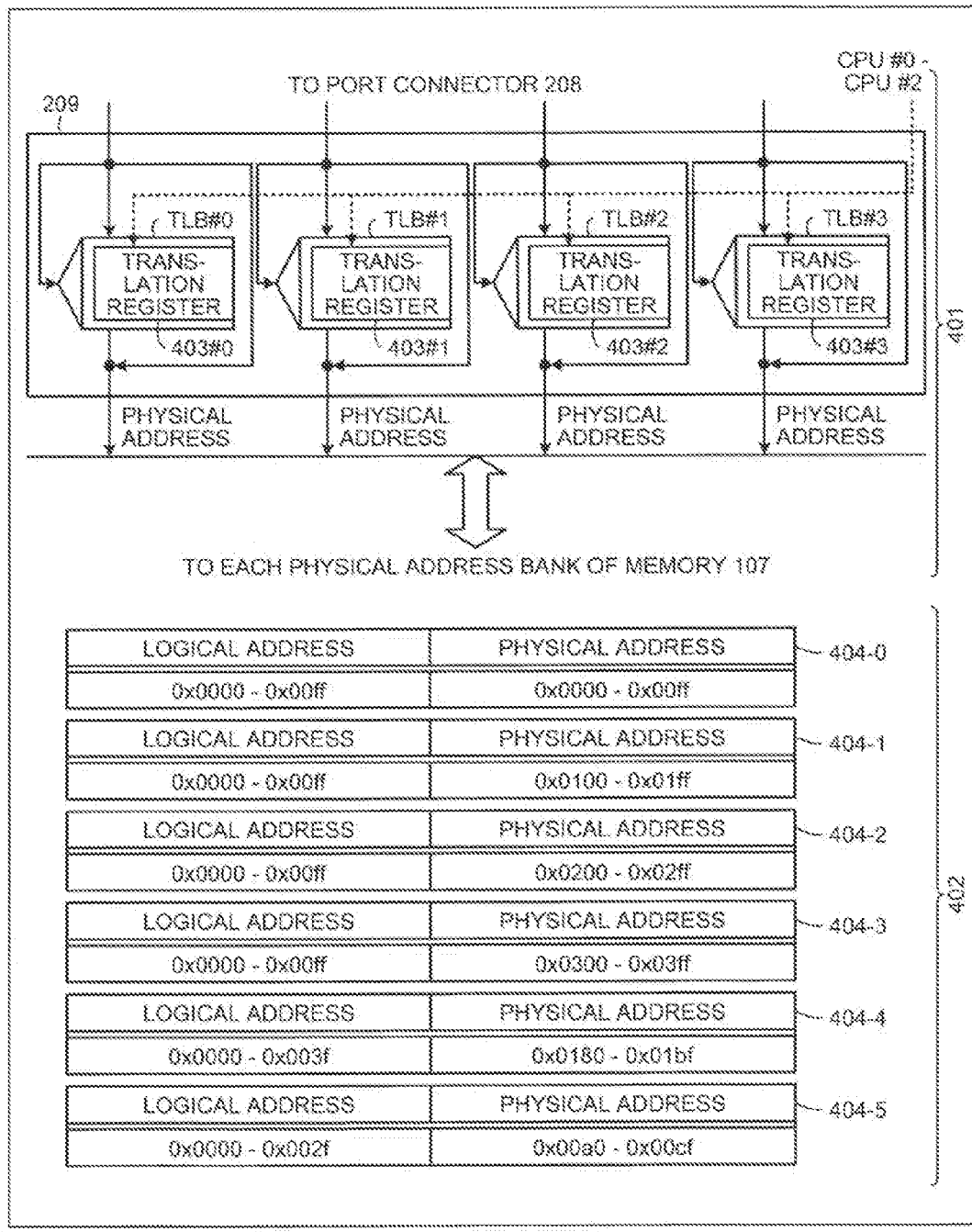
FIG. 4 is an explanatory view of the interior of an address translator 209 and an example of a setting method thereof.

FIG. 4 is an explanatory view of the interior of the address translator 209 and an example of the setting method thereof. The explanatory view designated by reference numeral 401 is an explanatory view of the interior of the address translator 209. The address translator 209 is included in the memory controller 112 and intervenes between the port connector 208 and the memory 107 to perform conversion between the logical addresses and physical addresses of the ports 113#0 to 113#3 and the ports 114#0 to 114#3. The logical address-physical address translation of each port is controlled by translation registers 403#0 to 403#3 accessed by the CPUs #0 to #2.

For example, the translation register 403#0 controls a translation lookaside buffer (TLB) #0. The controlled TLB #0 performs translation between the logical address space and the physical address space of the ports 113#0 and 114#0. In the same manner, the translation registers 403#1 to 403#3 control TLBs #1 to #3, respectively, to perform respective translations between the logical address spaces and the physical address spaces of the ports 113#1 to 113#3 and 114#1 to 114#3.

The explanatory view designated by reference numeral 402 is an explanatory view of a setting example of the translation register 403. The contents set in the TLB #0 change according to the setting of the translation register 403#0. The translation register 403 includes two fields, i.e., a logical address field and a physical address field. The logical address field stores the range of values of the logical address, the access of which is requested by an app. The physical address field stores the range of the physical addresses in the memory 107 corresponding to the logical addresses.

The CPUs 105 notify the address translator 209 of an address translation table 404 that has the same fields as the translation register 403, and consequently, the address translator 209 sets the address translation table 404 into the translation register 403. A setting example of the address translation table 404 includes for example address translation tables 404-0 to 404-5.

As an example, a case is assumed where the CPU #0 among the CPUs #0 to #2 sets the translation registers 403#0 to 403#3. For example, the CPU #0 stores the translation register 403#0 into the address translation table 404-0, whereby the TLB #0 is set to the address translation table 404-0. The address translation table 404-0 stores a record that translates a logical address space 0x0000 to 0x00ff to a physical address space 0x0000 to 0x00ff of the memory block 210#0.

Similarly, the address translation table 404-1 stores a record that translates a logical address space 0x0000 to 0x00ff to a physical address space 0x0100 to 0x01ff of the memory block 210#1. The address translation table 404-2 stores a record that translates a logical address space 0x0000 to 0x00ff to a physical address space 0x0200 to 0x02ff of the memory block 210#2. The address translation table 404-3 stores a record that translates a logical address space 0x0000 to 0x00ff to a physical address space 0x0300 to 0x03ff of the memory block 210#3.

Although the address translation tables 404-0 to 404-3 translate all the physical addresses in the memory block 210, configuration may be such that only a portion of the address range may be translated. For example, the address translation table 404-4 stores a record that translates a logical address space 0x0000 to 0x003f to a physical address 0x0180 to 0x01bf of the memory block 210#1. Similarly, the address translation table 404-5 stores a record that translates a logical address space 0x0000 to 0x002f to a physical address space 0x00a0 to 0x00cf of the memory block 210#0.

As an example, a case is assumed where the address translation table 404-1 is set in the translation register 403#0. In this case, for access via the port 113#0, the address translator 209 translates a logical address to be accessed by a device to a physical address that is in the memory block 210#1 and accessed via the port 114#1.

Accordingly, a given app accessing the memory 107 via the address translator 209 can access the logical address, which is a fixed address, without knowing the physical address of the storage area reserved for the given app.

Figure 5:
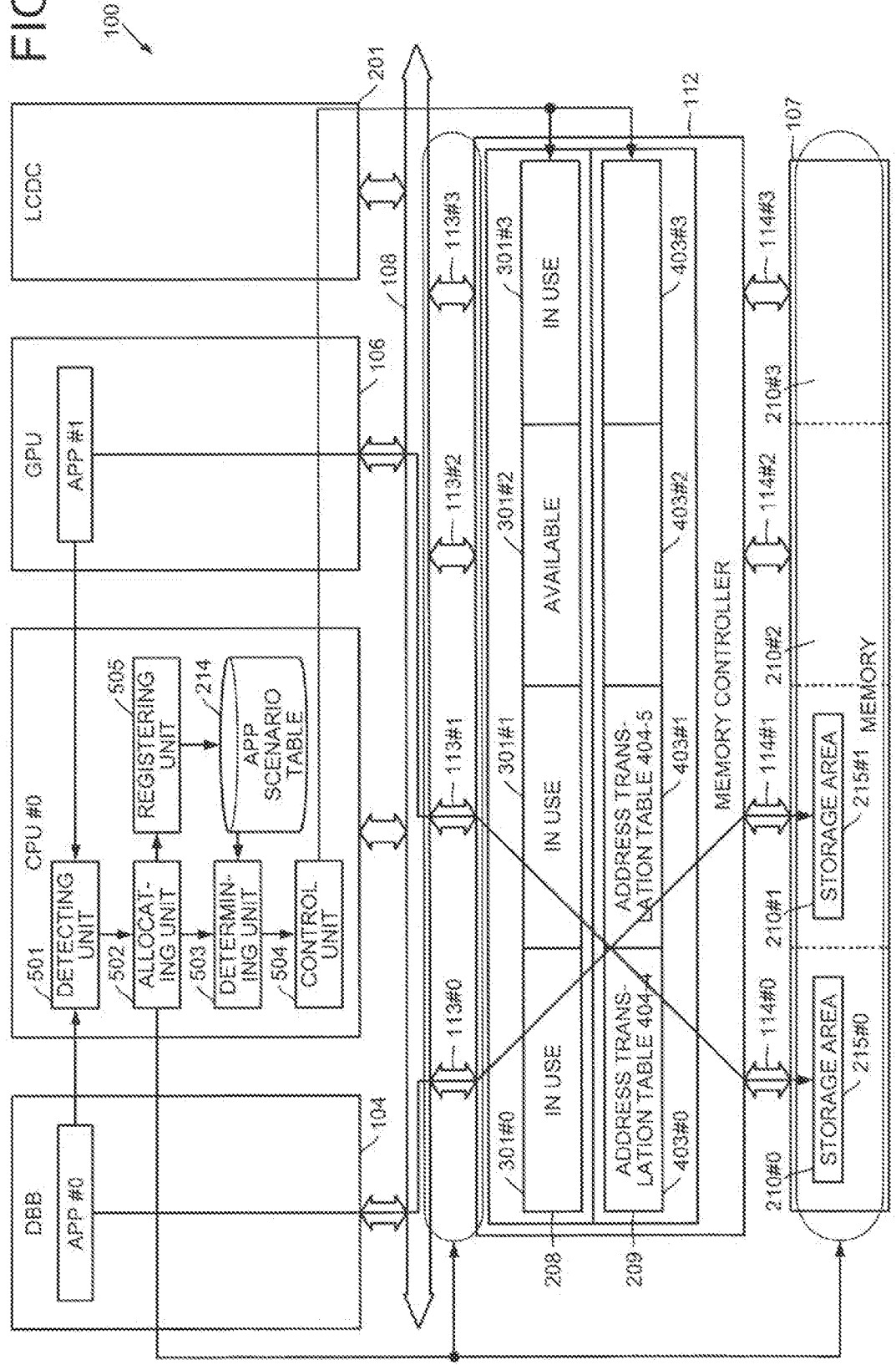
FIG. 5 is a block diagram of functions of the multi-core processor system 100.

Functions of the multi-core processor system 100 will be described. FIG. 5 is a block diagram of the functions of the multi-core processor system 100. The multi-core processor system 100 includes a detecting unit 501, an allocating unit 502, a determining unit 503, a control unit 504, and a registering unit 505. Functions (the detecting unit 501 to the registering unit 505) forming the control unit are implemented by the CPUs 105 executing programs stored in a storage device. The storage device is for example the memory 107, the flash ROM 204, etc.

Although the app scenario table 214 of FIG. 5 is described to be in the CPU #0, the app scenario table 214 is stored in a storage device such as the memory 107 and the flash ROM 204 at the time of the activation of the multi-core processor system 100. FIG. 5 assumes a state where the app scenario table 214 has been copied to the cache memory of the CPU #0 after the activation of the multi-core processor system 100. Although the detecting unit 501 to the registering unit 505 of FIG. 5 are depicted as functions of the CPU #0, the functions may be functions of the other CPUs among the CPUs 105.

The detecting unit 501 has a function of detecting activation of a first app. For example, the detecting unit 501 detects activation of the app #0. Information of the detection is stored to a storage area of the register, the cache memory, etc. of the CPU #0.

The allocating unit 502 has a function of allocating a port of the memory 107 used by the first app and of allocating a storage area corresponding to the port. For example, the allocating unit 502 allocates the port 113#1 among the ports 113 as the port to be used by the app #0 and allocates the storage area 215#0 as the storage area to be used by the app #0. Identification information of the allocated port, the address of the storage area, etc. are stored to a storage area of the register, the cache memory, etc. of the CPU #0.

If the first app detected by the detecting unit 501 is registered in the app scenario table 214, the allocating unit 502 may allocate among the ports 113, a first port for use by an app having scenario information. If the first app detected by the detecting unit 501 is not registered in the app scenario table 214, the allocating unit 502 may allocate among the ports 113, a second port for an app having no scenario information. The scenario information is information concerning the processing sequence at the time of the execution of a given app. Specific details of the scenario information will be described with reference to FIG. 7.

In the same manner, if the first app is registered in the app scenario table 214, the allocating unit 502 may allocate among the storage areas of the memory 107, a first storage area for an app having scenario information. If the first app is not registered in the app scenario table 214, the allocating unit 502 may allocate among the storage areas of the memory 107, a second storage area for an app having no scenario information.

For example, the multi-core processor system 100 may set the ports 113#0 and 113#1 as first ports for apps having scenario information and set the ports 113#2 and 113#3 as second ports for apps having no scenario information. For an app having scenario information, the allocating unit 502 allocates either of the ports 113#0 and 113#1 depending on the setting contents. For an app having no scenario information, the allocating unit 502 allocates either of the ports 113#2 and 113#3.

If the first app is an app having scenario information, the allocating unit 502 determines whether an available first port is present. The allocating unit 502 may allocate an available first port when an available first port is present and may allocate a second port when no available first port is present.

As an example, a case is assumed where the ports 113#0 and 113#1 are being used by apps having scenario information. In this case, if the first app is an app having scenario information, the allocating unit 502 determines that no available first port is present and allocates a second port. Information indicating allocated ports and storage areas may be stored to the app scenario table 214 as well as to the storage area of the register, the cache memory, etc.

The determining unit 503 has a function of determining based on the app scenario table 214 in which allocated devices that execute a first process of the first app are registered, the allocation of the allocated device for the first process of the first app. For example, among a record group of the app scenario table 214, the determining unit 503 refers to a record of the app #0 whose activation has been detected, and determines the allocation of the DBB 104 as the allocated device to execute the first process.

If no allocated device for executing the first process of the first app is registered in the app scenario table 214, the determining unit 503 may allocate to the first app, a device having the lowest load. Identification information of the determined device is stored to a storage area of the register, the cache memory of the CPU #0. As a device load calculation method, the CPU #0 calculates, as a load, the ratio of the device execution time per unit time. As another calculation method, the CPU #0 may make the calculation based on the number of processes allocated to a device. The amount of the processing data imparted to the processing allocated to a device may be calculated as the device load. The processing data of each process is preliminarily measured.

The control unit 504 has a function of controlling the memory controller 112 so that the allocated device determined by the determining unit 503 accesses, via a port allocated by the allocating unit 502, a storage area allocated by the allocating unit 502.

For example, a case is assumed where the port 113#1 and the storage area 215#0 are allocated by the allocating unit 502. In this case, the control unit 504 controls the address translator 209 so that the access destination of the port 131#1 is the storage area 215#0 and controls the port connector 208 so that the port 113#1 is used. For example, the control unit 504 sets the setting register 301#1 of the port connector 208 to "in use". The control unit 504 sets in the translation register 403#1 of the address translator 209, the address translation table 404-5 for translation between the logical address accessed by the allocated device and the physical address of the storage area in the memory 107.

When the first app is switched to the second app in a given device, the control unit 504 may acquire from the app scenario table 214, identification information of a port corresponding to the second app and notify the port connector 208 of the corresponding port. For example, when the app #0 is switched to the app #1 for the DBB 144, the control unit 504 acquires identification information of a port corresponding to the app #1 and notifies the port connector 208 if the corresponding port.

Although the control unit 504 has a function of controlling the memory controller 112 so that the given device performs access via a port allocated thereto, the control unit 504 may control the given device so that the given device controls the memory controller 112.

The registering unit 505 has a function of registering into the app scenario table 214, the port and storage area address allocated by the allocating unit 502. For example, the registering unit 505 registers into the record for the app #0 in the app scenario table 214, the port 113#1 and the address of the storage area 215#0 allocated by the allocating unit 502.

During the execution of the first app, the registering unit 505 may record the number of times the memory 107 is accessed and the number of times the device is used and, based on the access count, the use count, and the first app processing load, may register the first app into the app scenario table 214. For example, when the access count and the device use count reach and exceed predetermined threshold values, the registering unit 505 performs the registration into the app scenario table 214.

In this manner, the multi-core processor system 100 is a system including the memory 107, the memory controller 112 having plural ports for from the input and output of data with respect to the memory 107, and the device group that can access the memory 107. The multi-core processor system 100 detects activation of a given app based on the app scenario table 214 that, for each app, stores processes to be executed by the devices. Upon detecting an activation of the given app, the multi-core processor system 100 allocates an available port among the ports 103#0 to 103#3 as a port to be used by the given app and further allocates in the memory 107, a storage area to be used by the given app.

After the allocation, the multi-core processor system 100 refers to the app scenario table 214 to determine as the allocated device, the device to be allocated for processing corresponding to the given app. After the determination, the multi-core processor system 100 controls the memory controller 112 to access the allocated storage area by way of a port that is allocated for the determined allocated device. Alternatively, the multi-core processor system 100 may control the allocated device to access the storage area corresponding to the allocated port.

If plural processes are present, the app scenario table 214 may store, for each app, the processes, devices executing the processes, and the sequence of the execution of the processes. Based on the app scenario table 214, the multi-core processor system 100 upon detecting completion of a specific process among the processes in the given app, may determine as the allocated device, the device that is to execute the process that follows the specific process.

FIG. 6 is an explanatory view of a setting example of the ports 113 and 114 and the memory block 210. The explanatory view of FIG. 6 depicts an example where a port to be used and a storage area to be used, among the ports 113 and 114 and in the memory block 210, are set based on whether the app has scenario information of the app scenario table 214. The scenario information will be described later with reference to FIG. 7.

For example, the multi-core processor system 100 sets, as ports and storage areas for apps having scenario information, the ports 113 and memory blocks 210 within a range designated by reference numeral 601. For example, the multi-core processor system 100 sets the ports 113#0 and 113#1 among the ports 113#0 to 113#3 as the ports for apps having scenario information. The multi-core processor system 100 sets the memory blocks 210#0 and 210#1 among the memory blocks 210#0 to 210#3 as the storage areas for apps having scenario information.

For example, the multi-core processor system 100 sets a port to be used by the video reproduction app 212 to be 113#0 and sets the memory block 210#1 as a storage area to be accessed by the video reproduction app 212. Thus, the video reproduction app 212 secures the storage area 215#1 to be used by the video reproduction app 212, in the memory block 210#1. Similarly, the multi-core processor system 100 sets a port to be used by the GUI app 213 to be 113#1 and sets the memory block 210#0 as a storage area to be accessed by the GUI app 213. Thus, the GUI app 213 secures the storage area 215#0 to be used by the GUI app 213, in the memory block 210#0.

The multi-core processor system 100 sets, as ports and storage areas for apps having no scenario information, the ports 113 and memory blocks 210 within a range designated by reference numeral 602. For example, the multi-core processor system 100 sets the ports 113#2 and 113#3 as the ports for app having no scenario information. The multi-core processor system 100 sets the memory blocks 210#2 and 210#3 among the memory blocks 210#0 to 210#3 as the storage areas for app having no scenario information.

The multi-core processor system 100 may set, as the storage area for app having no scenario information, a memory block 210#2-3 that is a combination of the memory blocks 210#2 and 210#3. For example, in the example of FIG. 6, the multi-core processor system 100 includes six apps having no scenario information and secures storage areas 603#0 to 603#5 as storage areas to be accessed by the apps.

FIG. 7 is an explanatory view of an example of the storage contents of the app scenario table 214. The app scenario table 214 stores, for each app, process execution information that is information at the time of the execution of the given app. The process execution information includes three items, i.e., scenario information, utilized port, and head physical address. The scenario information is information concerning the sequence of processing at the time of the execution of the given app. For example, the scenario information stores an identifier indicative of whether scenario information is present or absent. If the identifier indicates that the scenario information is present, the scenario information further includes a scenario information table 701 including three fields, i.e., a sequence field, a process field, and a related device field. The scenario information is created before the execution of the given app.

If the frequency of access of the memory 107 by a given app decreases or the number of times that a device is used decreases, neither access contention nor copy processing between devices will occur. Consequently, the multi-core processor system 100 need not perform the memory control method of the present embodiment. Accordingly, in such a case, information may be registered indicating that the scenario information of the given app is absent.

The sequence field stores the sequence of invoking the processes. The process field stores information indicative of the contents of processing. For example, the process field stores a function name and a value such as a head address to a function. The related device field stores identification information of a device executed by the process indicated in the process field. The related device field may set a device that is often invoked consequent to the CPUs 105 executing the process stored in the processing field.

The utilized port field stores identification information of a port among the ports 113#0 to 113#3 and set for the given app.

The port identification information is for example information such as a port No. enabling the port 113 to be uniquely identified. The head physical address stores a head value of the physical address of the storage area allocated to the given app. The utilized port and the head physical address are set when the given app starts execution.

For example, apps #0 to #N are registered into the app scenario table 214 of FIG. 7. N is an integer greater than or equal to 2. The state of the app scenario table 214 depicted in FIG. 7 assumes that the apps #0 and #1 are under execution in the multi-core processor system 100.

The apps #0 to #2 are registered as having scenario information and the respective scenario information includes scenario information tables 701#0 to 701#2. The app #N is registered as having no scenario information and the scenario information includes no scenario information table 701.

In this state, according to the scenario information, the app #0 allows the DBB 104 to execute a funcA as first process and allows one of the CPUs 105 to execute a funcB as a second process. The app #0 further allows the GPU 106 to execute a funcC as a third process, allows one of the CPUs 105 to execute a funcD as a fourth process, and allows the LCDC 210 to execute a funcE as fifth process. The app #0 sets the port 113#0 among the ports 113 as the port to be used and allocates 0x0180 as the physical address of the memory 107.

According to the scenario information, the app #1 allows one of the CPUs 105 to execute a funcF as a first process and allows the GPU 106 to execute a funcG as a second process. The app #1 further allows one of the CPUs 105 to execute a funcH as a third process and allows the LCDC 210 to execute a funcI as a fourth process. The app #1 sets the port 113#1 among the ports 113 as the port to be used and allocates 0x00a0 as the physical address of the memory 107.

In the case of execution of the app #2, according to the scenario information, one of the CPUs 105 executes a funcJ as a first process and, continuing the processing, the LCDC 201 executes a funcK as an n-th process. n is an integer greater than or equal to 1. Since the execution of the app #2 has not yet started, no values are set for the port to be used or for the head physical address.

The app #N is an app registered as having no scenario information. When the app #N is executed, the utilized port of the app scenario table 214 is not set and the app #N accesses the memory 107 using one of the ports for an app having no scenario information as depicted in FIG. 6. The scenario information of the app #N is registered in the form of an identifier indicative of the absence of the scenario information. Set as the head physical address is the lead of the physical address reserved in the storage area for apps having no scenario information as depicted in FIG. 6.

FIGS. 8 to 13 depict a state when the apps #0 and #1 execute processes according to the app scenario table 214 depicted in FIG. 7. Time t1 is assumed to be the time when the app #0 executes, upon the reception of an execution start request, the process indicated to be first in the execution sequence. Similarly, time t2 is assumed to be the time when the app #0 executes the process indicated to be second in the execution sequence; time t3 is assumed to be the time when the app #0 executes the process indicated to be third in the execution sequence; time t4 is assumed to be the time when the app #0 executes the process indicated to be fourth in the execution sequence; and time t5 is assumed to be the time when the app #0 executes the process indicated to be fifth in the execution sequence.

The app #1 is assumed to receive an execution start request at time t3 to execute the process indicated to be first in the execution sequence. Similarly, the app #1 is assumed to execute, at time t4, the process indicated to be second in the execution sequence and to execute, at time t5, the process indicated to be third in the execution sequence. Time t6 is assumed to be the time when the app #1 executes the process indicated to be fourth in the execution sequence. In FIGS. 8 to 13, a suffix code "_tx" attached to the app scenario table 214 indicates the contents of the app scenario table 214 at time tx.

A case is assumed where, among the processes executed by the apps #0 and #1, processes executed by the CPUs 105 are executed by the CPU #0 among the CPUs 105. The CPU having the lowest load among the CPUs 105 may execute the processes to be executed by the CPUs 105.

Since the utilization state of the ports for apps having scenario information is stored in the app scenario table 214, available ports can be determined. Accordingly, the multi-core processor system 100 sets available ports to non-connection, to thereby reduce power consumption. Since the utilization state of the ports for apps having no scenario information is not stored in the app scenario table 214, available ports cannot be determined and hence, the port connector 208 sets the ports for apps having no scenario information to be continuously "in use".

The multi-core processor system 100 may also store the utilization state of the ports for apps having no scenario information so that available ports among the ports for apps having no scenario information can be set to "not in use".

FIG. 8 is an explanatory view of the state at time t1 in the multi-core processor system 100 according to the operations in the app scenario table 214. When the app #0 receives an execution start request at time t1, the multi-core processor system 100 selects as a port for use, the port 113#0 among ports for apps having scenario information. After the selection, the multi-core processor system 100 notifies the port connector 208 of the use of the port 113#0. Upon receiving the notification, the port connector 208 sets the setting register 301#0 to "in use".

The multi-core processor system 100 further selects the memory block 210#1 from among storage areas for apps having scenario information. The multi-core processor system 100 allocates to the app #0, a storage area 801 as an available area of the memory block 210#1. Here, it is assumed that the physical address range of the storage area 801 is values set in the physical address field of the address translation table 404-4.

After the allocation, the multi-core processor system 100 notifies the address translator 209 of the address translation table 404-4. Upon receiving the notification, the address translator 209 sets the translation register 403#0 into the address translation table 404-4. After the setting, the multi-core processor system 100 registers the set port 113#0 and a head address 0x0180 of the allocated storage area 801 into the app scenario table 214. As a result of the registration, the values of the app scenario table 214 result in the contents indicated by an app scenario table 214_t1. Through the above settings, the DBB 104 executes the funcA of the app #0 at time t1 and accesses the storage area 801 of the memory block 210#1, via the port 113#0.

Figure 9:
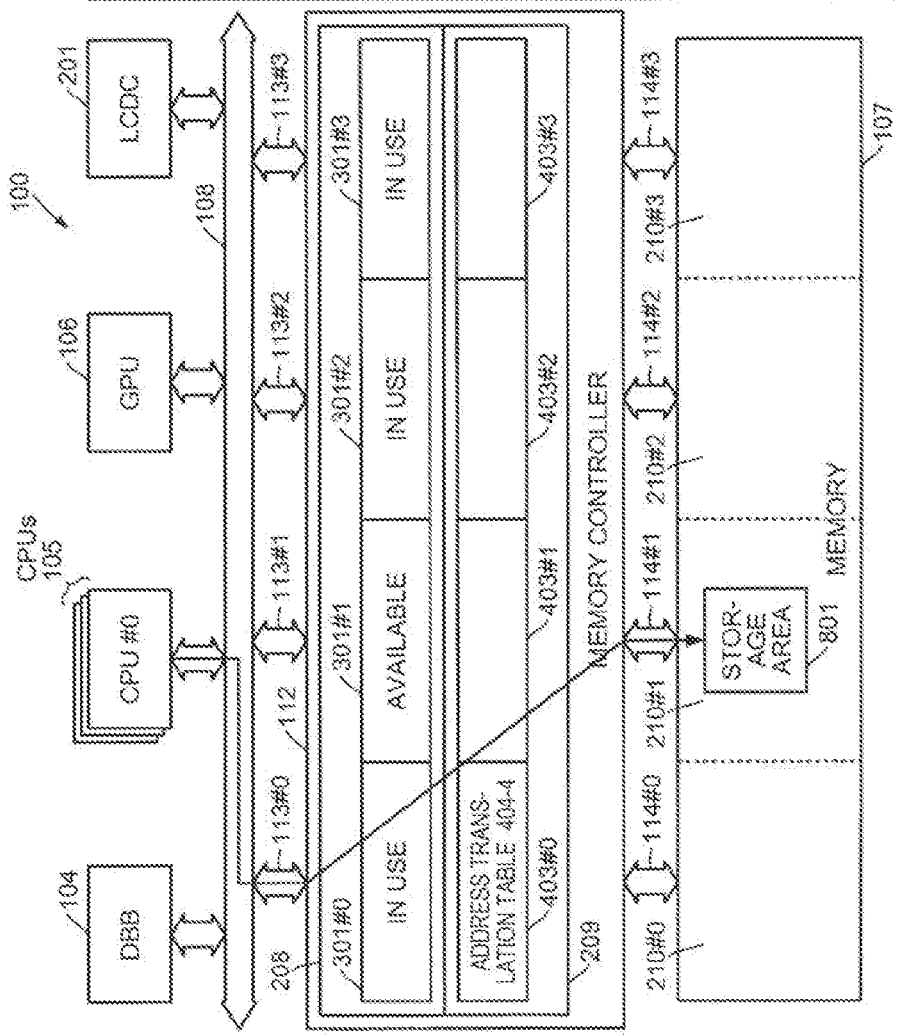
FIG. 9 is an explanatory view of the state at time t2 in the multi-core processor system 100 according to the operations of the app scenario table 214.

FIG. 9 is an explanatory view of the state at time t2 in the multi-core processor system 100 according to the operations of the app scenario table 214. When the app #0 is assigned to the CPU #0 among the CPUs 105 at time t2, the multi-core processor system 100 notifies the port connector 208 of use of the port 113#0 and notifies the address translator 209 of the address translation table 404-4. Upon receiving the notification, the port connector 208 sets the setting register 301#0 to "in use". Similarly, upon receiving the notification, the address translator 209 sets the translation register 403#0 into the address translation table 404-4. The app scenario table 214_t2 is equivalent in contents to the app scenario table 214_t1.

Although time t2 is subsequent time t1, time t2 needs not be immediately after time t1. If time t2 is not immediately after time t1, the setting values of the setting register 301#0 and the translation register 403#0 may possibly be altered between time t1 and time t2 as a result of an execution of another app. Accordingly, at time t2 again, the multi-core processor system 100 gives notification of use of the port 113#0 and the address translation table 404-4. If time t2 is immediately after time t1, the multi-core processor system 100 need not perform the re-notification.

Through the above settings, the CPU #0 at time t2 executes the funcB of the app #0 and accesses the storage area 801 of the memory block 210#1, via the port 113#0. In this manner, without transferring data stored in the storage area 801, the multi-core processor system 100 can produce the same effect as that in a case of transferring the data from the management area of the DBB 104 to the management area of the CPUs 105.

Figure 10:
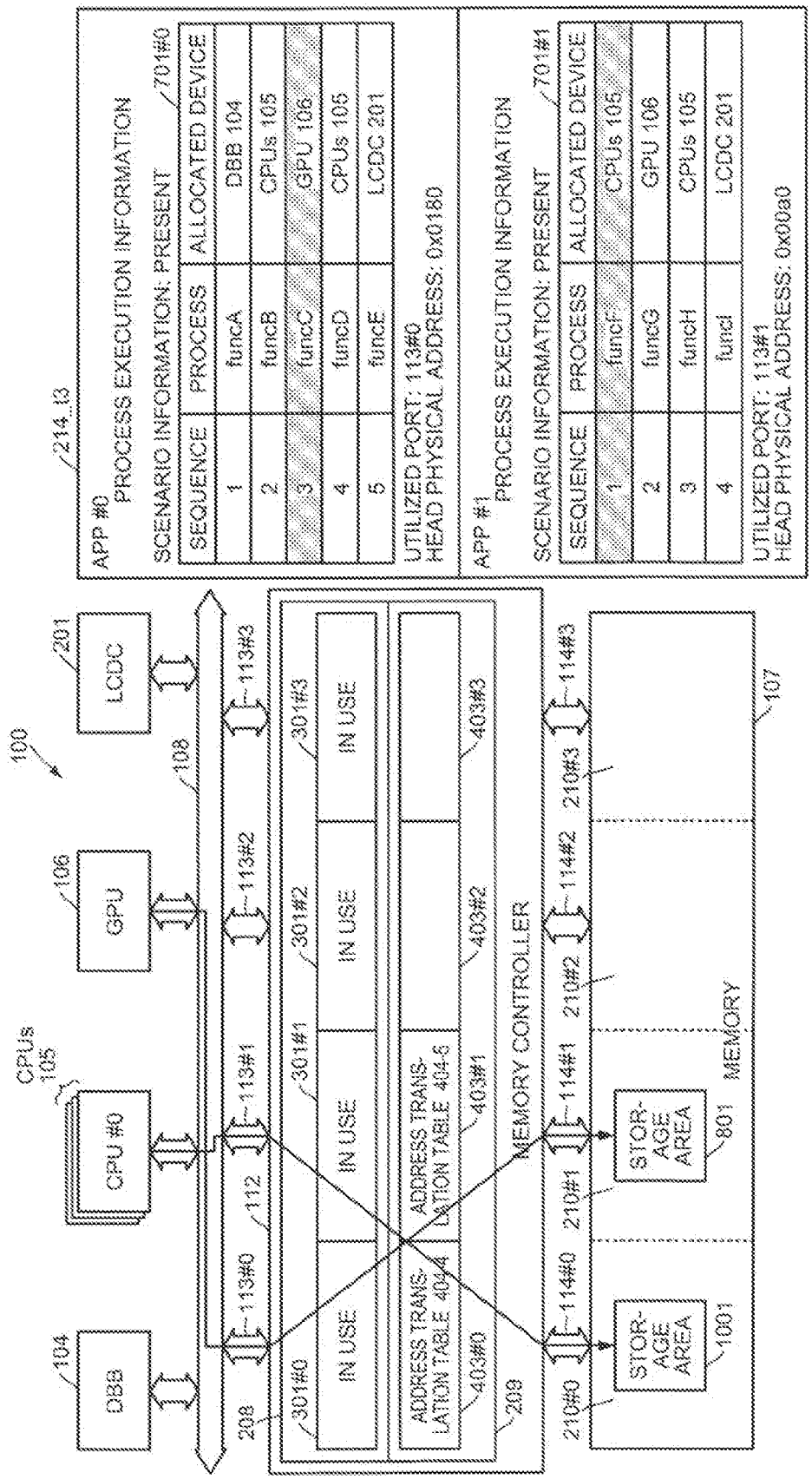
FIG. 10 is an explanatory view of the state at time t3 in the multi-core processor system 100 according to the operations of the app scenario table 214.

FIG. 10 is an explanatory view of the state at time t3 in the multi-core processor system 100 according to the operations of the app scenario table 214. When the app #0 is assigned to the GPU 106 at time t3, the multi-core processor system 100 notifies the port connector 208 of use of the port 113#0 and notifies the address translator 209 of the address translation table 404-4. Upon receiving the notification, the port connector 208 sets the setting register 301#0 to "in use". Similarly, upon receiving the notification, the address translator 209 sets the translation register 403#0 into the address translation table 404-4.

When the app #1 receives an execution start request at time t3, the multi-core processor system 100 selects as a port to be used, the port 113#1 among ports for apps having scenario information. After the selection, the multi-core processor system 100 notifies the port connector 208 of use of the port 113#1. Upon receiving the notification, the port connector 208 sets the setting register 301#1 to "in use".

The multi-core processor system 100 further selects the memory block 210#0 from among storage areas for apps having scenario information. The multi-core processor system 100 allocates to the app #1, a storage area 1001 as an available area of the memory block 210#0. Here, it is assumed that the physical address range of the storage area 801 is values set in the physical address field of the address translation table 404-5.

After the allocation, the multi-core processor system 100 notifies the address translator 209 of the address translation table 404-5. Upon receiving the notification, the address translator 209 sets the translation register 403#1 into the address translation table 404-5. The multi-core processor system 100 registers the set port 113#1 and a head address 0x00a0 of the allocated storage area 1001 into the app scenario table 214. As a result of the registration, the contents of the app scenario table 214 result in the contents of an app scenario table 214_t3.

Through the above settings, the GPU 106 at time t3 executes the funcC of the app #0 and accesses the storage area 801 of the memory block 210#1, via the port 113#0. The CPU #0 at time t3 executes the funcF of the app #1 and accesses the storage area 1001 of the memory block 210#0, via the port 113#1. In this manner, the multi-core processor system 100 allows the GPU 106 and the CPU #0 to access separate ports and separate storage areas, to thereby prevent any access contention. Similar to the multi-core processor system 100 at time t2, the multi-core processor system at time t3 need not transfer data stored in the storage area 801.

Figure 11:
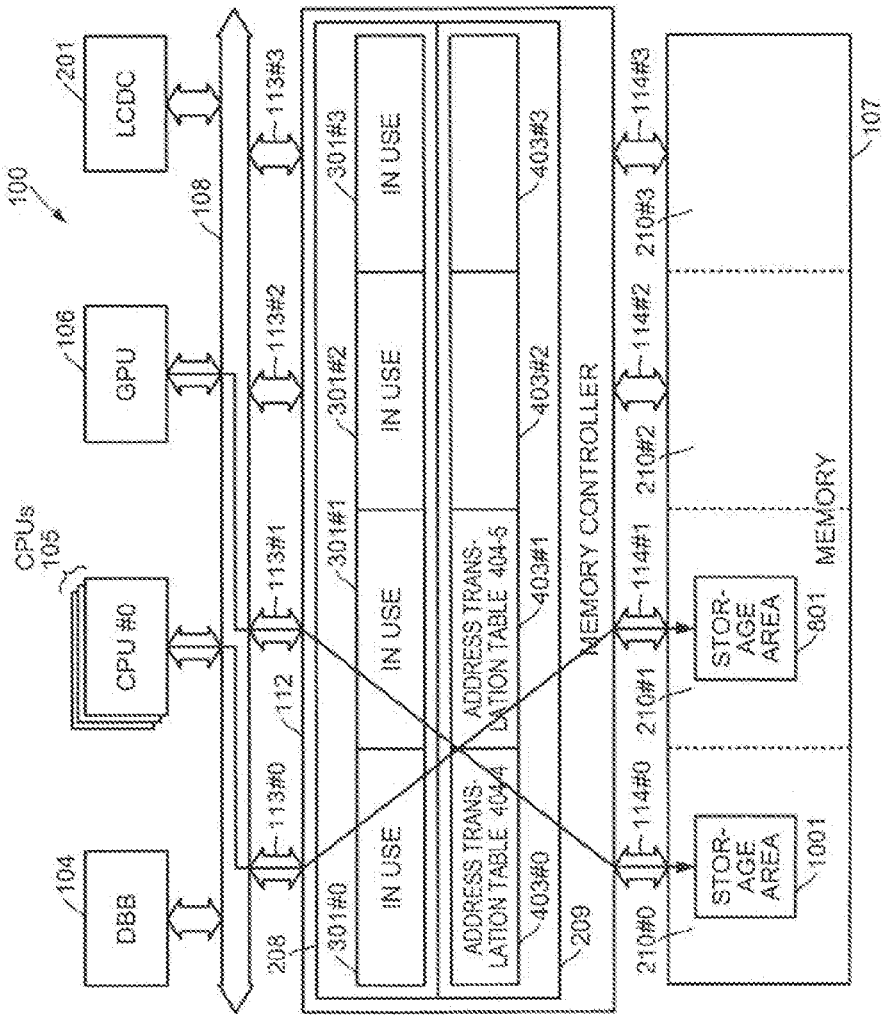
FIG. 11 is an explanatory view of the state at time t4 in the multi-core processor system 100 according to the operations of the app scenario table 214.

FIG. 11 is an explanatory view of the state at time t4 in the multi-core processor system 100 according to the operations of the app scenario table 214. When the app #0 is assigned to the CPU #0 among the CPUs 105 at time t4, the multi-core processor system 100 notifies the port connector 208 of use of the port 113#0 and notifies the address translator 209 of the address translation table 404-4. Upon receiving the notification, the port connector 208 sets the setting register 301#0 to "in use". Similarly, upon receiving the notification, the address translator 209 sets the translation register 403#0 into the address translation table 404-4.

In a like manner, when the app #1 is assigned to the GPU 106 at time t4, the multi-core processor system 100 notifies the port connector 208 of use of the port 113#1 and notifies the address translator 209 of the address translation table 404-5. Upon receiving the notification, the port connector 208 sets the setting register 301#1 to "in use". Similarly, upon receiving the notification, the address translator 209 sets the translation register 403#1 into the address translation table 404-5. An app scenario table 214_t4 becomes equivalent in contents to the app scenario table 214_t3.

Through the above settings, the CPU #0 at time t4 executes the funcD of the app #0 and accesses the storage area 801 of the memory block 210#1, via the port 113#0. The GPU 106 at time t4 executes the funcG of the app #1 and accesses the storage area 1001 of the memory block 210#0, via the port 113#1. In this manner, the multi-core processor system 100 allows the CPU #0 and the GPU 106 to access separate ports and separate storage areas, to thereby prevent any access contention. Similar to the multi-core processor system 100 at time t3, the multi-core processor system at time t4 need not transfer data stored in the storage area 801 and data stored in the storage area 1001.

Figure 12:
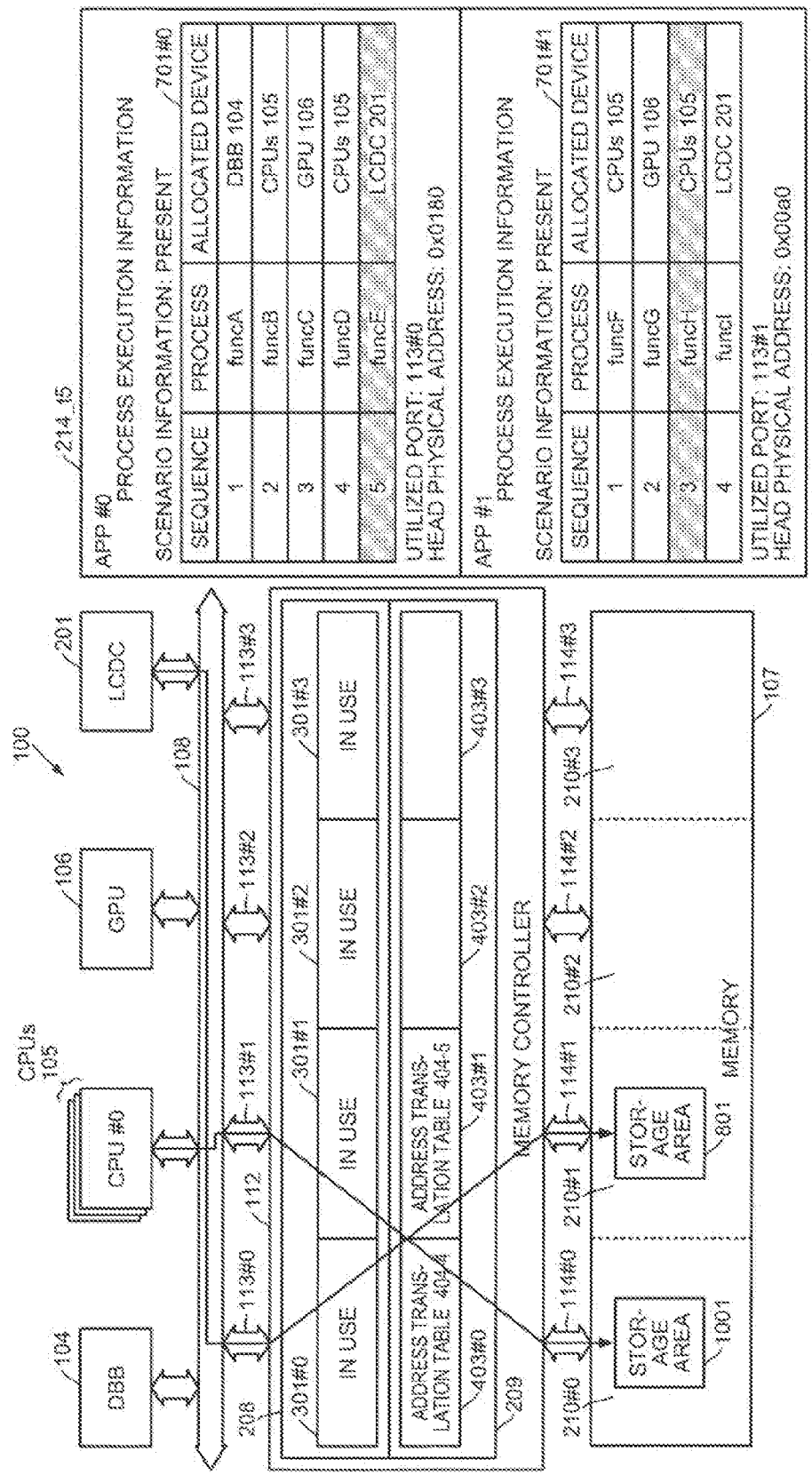
FIG. 12 is an explanatory view of the state at time t5 in the multi-core processor system 100 according to the operations of the app scenario table 214.

FIG. 12 is an explanatory view of the state at time t5 in the multi-core processor system 100 according to the operations of the app scenario table 214. When the app #0 is assigned to the LCDC 201 at time t5, the multi-core processor system 100 notifies the port connector 208 of use of the port 113#0 and notifies the address translator 209 of the address translation table 404-4. Upon receiving the notification, the port connector 208 sets the setting register 301#0 to "in use". Similarly, upon receiving the notification, the address translator 209 sets the translation register 403#0 into the address translation table 404-4. After the completion of the funcE by the LCDC 201, the ports and the storage areas are released. The release processing will be described with reference to FIG. 13.

In the same manner, when the app #1 is assigned to the CPU #0 among the CPUs 105 at time t5, the multi-core processor system 100 notifies the port connector 208 of use of the port 113#1 and notifies the address translator 209 of the address translation table 404-5. Upon receiving the notification, the port connector 208 sets the setting register 301#1 to "in use". Similarly, upon receiving the notification, the address translator 209 sets the translation register 403#1 into the address translation table 404-5. The app scenario table 214_t5 becomes equivalent in contents to the app scenario table 214_t4.

Through the above settings, the LCDC 201 at time t5 executes the funcE of the app #0 and accesses the storage area 801 of the memory block 210#1, via the port 113#0. The CPU #0 at time t5 executes the funcH of the app #1 and accesses the storage area 1001 of the memory block 210#0, via the port 113#1. In this manner, the multi-core processor system 100 allows the LCDC 201 and the CPU #0 to access separate ports and separate storage areas, to thereby obviate any access contention. Similar to the multi-core processor system 100 at time t4, the multi-core processor system at time t5 need not transfer data stored in the storage area 801 and data stored in the storage area 1001.

Figure 13:
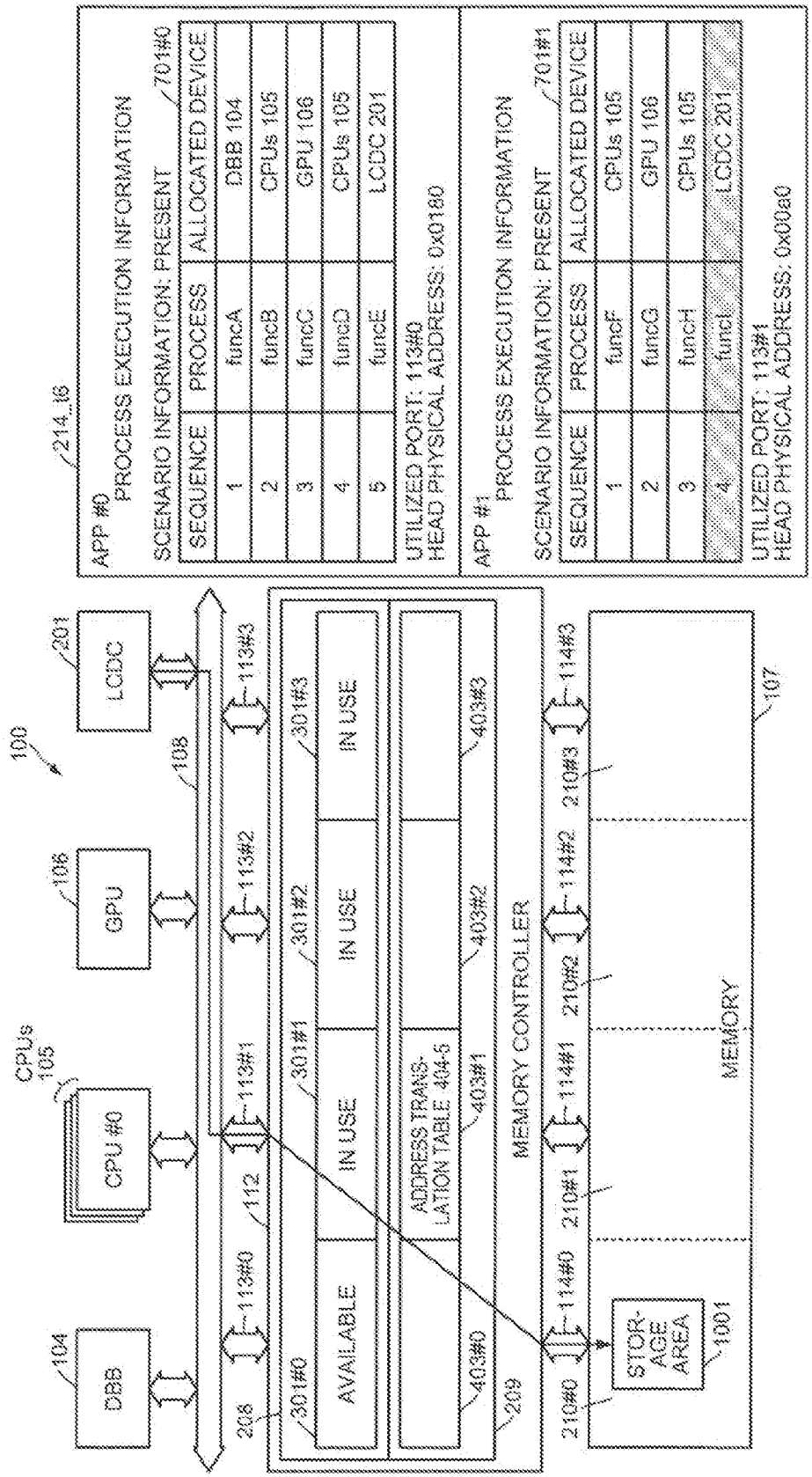
FIG. 13 is an explanatory view of the state at time t6 in the multi-core processor system 100 according to the operations of the app scenario table 214.

FIG. 13 is an explanatory view of the state at time t6 in the multi-core processor system 100 according to the operations of the app scenario table 214. When the app #0 ends after time 5 ends, the multi-core processor system 100 notifies the port connector 208 of the release of the port 113#0 as the utilized port. Upon receiving the notification, the port connector 208 sets the setting register 301#0 to "not in use". The multi-core processor system 10 releases the storage area 801 allocated to the app #0.

When the app #1 is assigned to the LCDC 201 at time t6, the multi-core processor system 100 notifies the port connector 208 of use of the port 113#1 and notifies the address translator 209 of the address translation table 404-5. Upon receiving the notification, the port connector 208 sets the setting register 301#1 to "in use". Similarly, upon receiving the notification, the address translator 209 sets the translation register 403#1 into the address translation table 404-5. Through the above settings, the LCDC 201 at time t6 executes the funcI of the app #1 and accesses the storage area 1001 of the memory block 210#1, via the port 113#1.

After the release of the port and the storage area by the app #0, the multi-core processor system 100 deletes the released port 113#0 and the released storage area 801 from the app scenario table 214. As a result of the deletion, the app scenario table 214 comes to have the contents indicated by an app scenario table 214_t6.

FIGS. 14 to 19 are flowcharts of a generation process of the app scenario table 214 and of a memory control process according to the app scenario table 214. Any one of the CPUs 105 may execute the generation process of the app scenario table 214 and the memory control process, but for simplicity of description, it is assumed that the CPU #0 executes the processes in FIGS. 14 to 19. The app scenario table 214 may be generated by the generation process depicted in FIG. 14 or may be created in advance by the designer.

The generation process of the app scenario table 214 is executed when a given app is activated. The memory control process is executed when any one of three cases occurs, i.e., a case where the given app is activated, a case where switching to another app is performed by a given device that is among plural devices, and a case where processing for a function of the given app allocated to the given device is completed.

Figure 14:
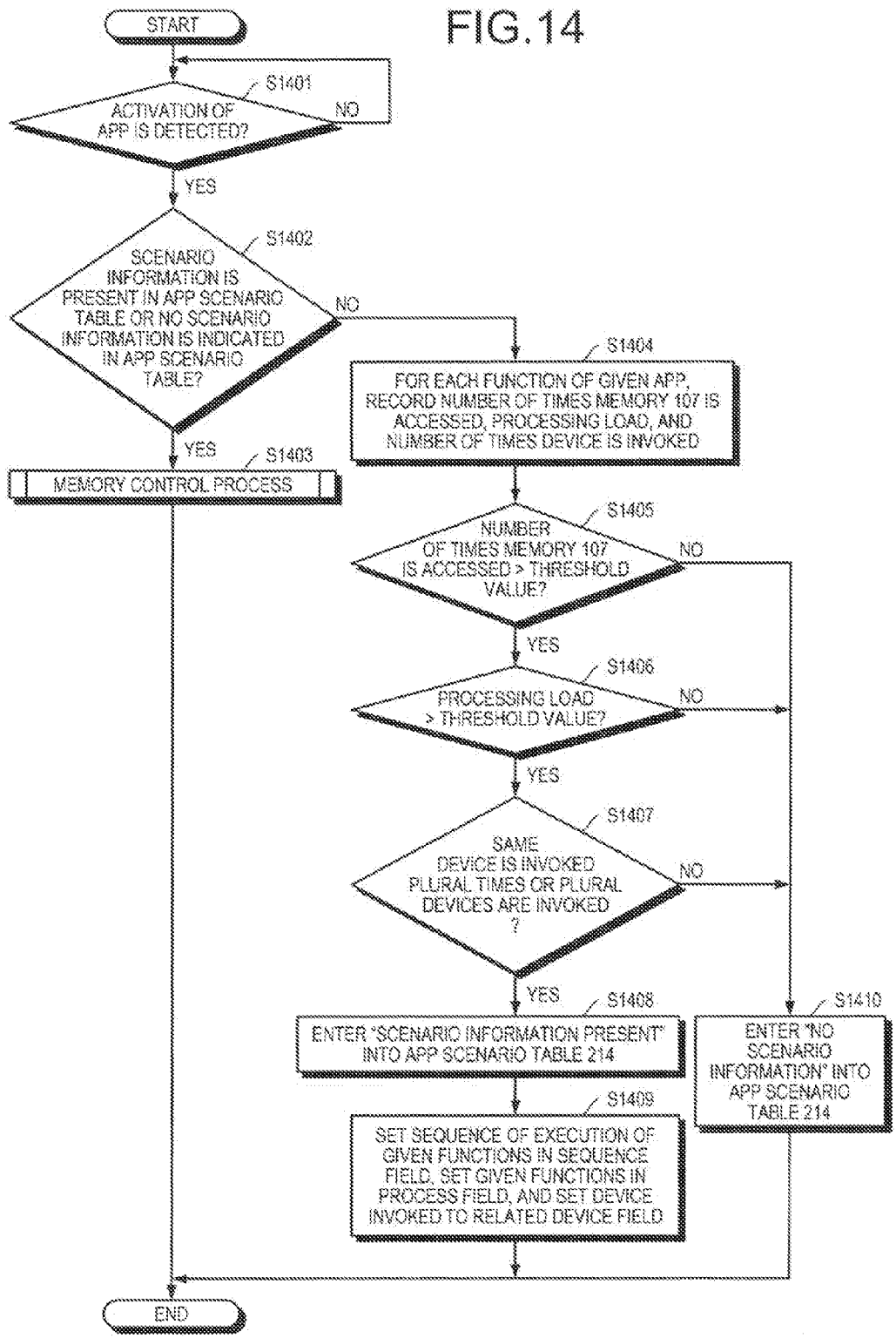
FIG. 14 is a flowchart of a generation process of the app scenario table 214.

FIG. 14 is a flowchart of the generation process of the app scenario table 214. The CPU #0 determines whether an app has been activated (step S1401). If no app has been activated (step S1401: NO), the CPU #0 returns to the operation at step S1401. If an app has been activated (step S1401: YES), the CPU #0 determines whether scenario information is present for the given app in the app scenario table 214 or whether "no scenario information" is indicated in the app scenario table 214 (step S1402). If scenario information is present or if "no scenario information" is indicated (step S1402: YES), the CPU #0 executes the memory control process (step S1403).

A case where scenario information is present is a case where process execution information of the given app is present in the app scenario table 214. Accordingly, the absence of the process execution information of the given app in the app scenario table 214 means that scenario information is not present. A case where "no scenario information" is indicated is a case where "none" is entered in the scenario information of the given app in the app scenario table 214.

If the scenario information is not present (step S1402: NO), the CPU #0 records, for each function of the given app, the number of times the memory 107 is accessed, the processing load, and the number of times a device is invoked (step S1404). The processing load may be a ratio per unit time of assignment of the given app to a device or may be a measured value by a profile, etc.

After the recording, the CPU #0 determines whether the number of times the memory 107 is accessed is more than a threshold value (step S1405). If the access count is not more than the threshold value (step S1405: NO), the CPU #0 enters "no scenario information" into the app scenario table 214 (step S1410). If the access count is more than the threshold value (step S1405: YES), the CPU #0 then determines whether the processing load is more than a threshold value (step S1406).

If the processing load is not more than the threshold value (step S1406: NO), the CPU #0 goes to operation at step S1410. If the processing load is more than the threshold value (step S1406: YES), the CPU #0 further determines whether a given app function invokes the same device plural times and whether plural devices are invoked (step S1407).

If a single device is invoked at most one time (step S1407: NO), the CPU #0 goes to the operation at step S1410. If the same device is invoked plural times or if plural devices are invoked (step S1407: YES), the CPU #0 enters "scenario information present" into the app scenario table 214 (step S1408).

The CPU #0 then sets the sequence of execution of given functions in the sequence field of the given app record of the scenario information table 701, sets the given functions in the process field, and sets the device invoked to the related device field (step S1409). After the completion of the steps S1403 and S1409 or S1410, the CPU #0 terminates the generation process of the app scenario table 214. When the given app is again activated, the CPU #0 follows the route of step S1401: YES.

The threshold value for the operations at steps S1405 and S1406 may be a threshold value per unit time. For example, a case is assumed where the given app execution time is 0.5 (sec), the access count recorded at step S104 is 700 times, and the threshold value at step S1405 is 1000 (times/sec). In this case, the CPU #0 regards the operation at step S1405 as being YES based on 700/0.5=1400>1000 and continues the YES route. The CPU #0 calculates the processing load in the same manner as in the case of the access count.

Figure 15:
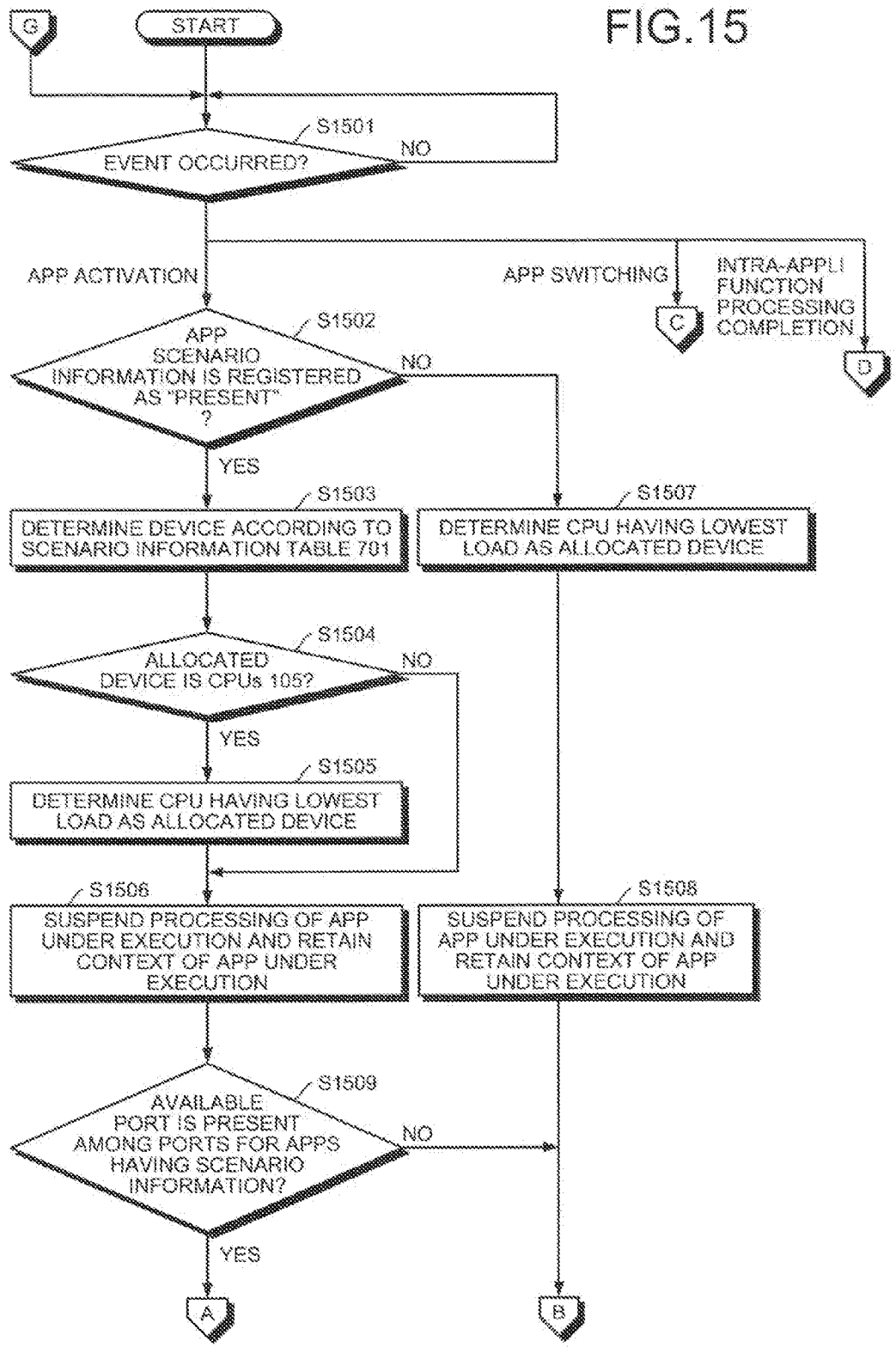
FIG. 15 is a flowchart (1) of a memory control process.

FIG. 15 is a flowchart (1) of the memory control process. The CPU #0 determines whether an event has occurred (step S1501). If an app activation event has occurred (step S1501: app activation), the CPU #0 determines whether the app scenario information is registered as "present" (step S1502). If the scenario information is registered as "present" (step S1502: YES), the CPU #0 determines the allocated device according to the scenario information table 701 (step S1503). After the determination, the CPU #0 determines whether the allocated device is to be the CPUs 105 (step S1504).

If the allocated device is to be the CPUs 105 (step S1504: YES), the CPU #0 determines the CPU having the lowest load as the allocated device (step S1505). If the allocated device is not to be the CPUs 105 (step S1504: NO) or if the CPU having the lowest load has been determined as the allocated device, the CPU #0 suspends the processing of the app under execution and retains the context of the app under execution (step S1506). The context is data used by the app such as a stack pointer and a program counter indicating a CPU register value.

If the scenario information is not present or if the scenario information is registered as "none" (step S1502: NO), the CPU #0 determines the CPU having the lowest load as the allocated device (step S1507). After the determination, the CPU #0 suspends the processing of the app under execution and retains the context of the app under execution (step S1508).

After the completion of step S1506, the CPU #0 determines whether an available port is present among ports for apps having scenario information (step S1509). As a method of determining whether an available port is present, the CPU #0 may check ports in use registered in the app scenario table 214 to determine whether an available port is present. If an available port is present (step S1509: YES), the CPU #0 goes to the operation at step S1601 depicted in FIG. 16. If no available port is present (step S1509: NO) or after the completion of the operation at step S1508, the CPU #0 goes to the operation at step S1606 depicted in FIG. 16.

If an app switching event occurs (step S1501: app switching), the CPU #0 goes to the operation at step S1701 of FIG. 17. Similarly, if an intra-app function processing completion event occurs (step S1501: intra-app function processing completion), the CPU #0 goes to the operation at step S1801 depicted in FIG. 18. If no event occurs (step S1501: no event), the CPU #0 returns to the operation at step S1501.

FIG. 16 is a flowchart (2) of the memory control process. After the completion of step S1509: YES, the CPU #0 notifies the port connector 208 of the allocation of an available port (step S1601). Upon receiving the notification, the port connector 208 sets the setting register 301 corresponding to the notified port to "in use" (step S1602) and sends completion notification to the source of the notification (step S1603). Upon receiving the completion notification, the CPU #0 registers into the app scenario table 214, identification information of the allocated port (step S1604). After the registration, the CPU #0 allocates an available storage area from among the storage areas for apps having scenario information (step S1605).

After the completion of the operation at step S1509: NO or at step S1508, the CPU #0 notifies the port connector 208 of the allocation of a port for apps having no scenario information (step S1606). Although after the operation at step S1606, the port connector 208 executes steps S1602 and S1603, the description thereof will be omitted herein since the processing executed by the port connector 208 is the same. After the notification, the CPU #0 allocates an available storage area from among the storage areas for apps having no scenario information (step S1607).

After the operation at step S1605 or S1607, the CPU #0 registers a head address of the allocated storage area into the app scenario table 214 (step S1608). After the registration, the CPU #0 notifies the address translator 209 of the address translation table that translates the physical address of the allocated storage area to the logical address (step S1609). The notification contents include identification information of the allocated port.

Upon receiving the notification, the address translator 209 sets the address translation table into the translation register 403 corresponding to the allocated port (step S1610) and sends completion notification to the notification source (S1611). Upon receiving the completion notification, the CPU #0 notifies the allocated device of a start of execution of the given app (step S1612) and goes to the operation at step S1501.

FIG. 17 is a flowchart (3) of the memory control process. If an app switching event occurs at a specific device (step S1501: app switching), the CPU #0 determines whether scenario information of the app executed after the switching is registered as being "present" (step S1701). If the scenario information is not present or if the scenario information is registered as "none" (step S1701: NO), the CPU #0 allocates a port from among the ports for apps having no scenario information (step S1702).

After the allocation or if the scenario information of the app executed after the switching is registered as being "present" (step S1701: YES), the CPU #0 notifies the port connector 208 of a connection port of the app executed after the switching (step S1703). After the notification, the CPU #0 notifies the address translator 209 of an address translation table for the app executed after the switching and registered in an execution queue (step S1704). The execution queue is a queue of apps allocated to devices and awaiting execution.

Although at step S1703 the port connector 208 of FIG. 16 executes the operations at steps S1602 and S1603, the description thereof will be omitted for FIG. 17 due to the processing executed by the port connector 208 being the same. The processing of the address translator 209 executed after the operation at step S1704 is the same as the processing of FIG. 16 and hence, the description thereof will be omitted for FIG. 17. After the notification, the CPU #0 notifies the given device of execution of the app to be executed after the switching (step S1705), and goes to the operation at step S1501.

FIG. 18 is a flowchart (4) of the memory control process. If an intra-app function processing completion event occurs in a specific device (step S1501: intra-app function processing completion), the CPU #0 determines whether the scenario information is registered as being "present" (step S1801). If the scenario information is not present or if the scenario information is registered as "none" (step S1801: NO), the CPU #0 goes to the operation at step S1905 depicted in FIG. 19. If the scenario information is registered as being "present" (step S1801: YES), the CPU #0 determines whether a subsequent record of the record for the completed function is present in the scenario information table (step S1802).

If a subsequent record is present (step S1802: YES), the CPU #0 determines as the allocated device, a device stored in the related device field of the subsequent record, according to the scenario information table 701 (step S1803). After the determination, the CPU #0 registers the given app into the execution queue of the allocated device (step S1804). After the registration, the CPU #0 goes to the operation at step S1901 depicted in FIG. 19.

If no subsequent record is present (step S1802: NO), the CPU #0 notifies the port connector 208 of the release of the port (step S1805). Upon receiving the notification, the port connector 208 sets the port to "not in use" (step S1806) and sends completion notification to the notification source (step S1807). Upon receiving the completion notification, the CPU #0 deletes from the app scenario table 214, the identification information of the released port (step S1808). The CPU #0 then releases the storage area (step S1809) and deletes from the app scenario table 214, a head address of the released storage area (step S1810). After the deletion, the CPU #0 goes to the operation at step S1901 of FIG. 19.

FIG. 19 is a flowchart (5) of the memory control process. After the completion of the operation at step S1804 or S1810, the CPU #0 determines whether an app awaiting execution is present in the execution queue of the given device (step S1901). If no app is present (step S1901: NO), the CPU #0 goes to the operation at step S1501.

If an app is present (step S1901: YES), the CPU #0 notifies the port connector 208 of a connection port for the app to be executed next (step S1902). The app to be executed next is any one of the apps registered in the execution queue. For example, the CPU #0 may decide an app registered at the top of the execution queue as the app to be executed next.

After the notification, the CPU #0 notifies the address translator 209 of the address translation table of the app to be executed next (step S1903). Since the processing of the port connector 208 and the address translator 209 executed after the steps S1902 and S1903 is the same as that depicted in FIG. 16, the description thereof will be omitted for FIG. 19. After the notification, the CPU #0 notifies the given device of execution of the app to be executed next (step S1904), and goes to the operation at step S1501.

If the scenario information is not present or if the scenario information is registered as "none" (step S1801: NO), the CPU #0 releases the storage area (step S1905). After the release, the CPU #0 deletes from the app scenario table 214, the head address of the released storage area (step S1906). After the deletion, the CPU #0 determines whether an app awaiting execution is present in the execution queue of the given device (step S1907).

If an app is present (step S1907: YES), the CPU #0 notifies the given device of execution of the app to be executed next (step S1908). After the notification or if no app is present (step S1907: NO), the CPU #0 goes to the operation at step S1501.

As set forth hereinabove, according to the memory control method and system, the memory controller is controlled so that, when an app-assigned device executes processing for memory having plural ports, each app storage area is accessed via the app-assigned ports. This allows each device to access the memory, via separate ports, enabling the system to prevent the access contention.

If plural processes of a given app are present, the system may control the memory controller so that, after the completion of a specific process among the processes, the device that executes the next process is determined as the allocated device that accesses app-assigned ports and storage areas. In a system according to the prior art example, when joint operations are performed between devices, although access contention can be prevented if the storage areas managed by the devices are different, a problem arises in that a process for copying between the storage areas becomes necessary. The system according to the present embodiment enables such a process to be eliminated for copying between a storage area managed by a device that has not been determined for allocation and a storage area managed by a device that has been determined for allocation.

The system may register a port and a storage area used by a given app into the table. Accordingly, when another app is to use a port, the system refers to the table to allocate a port other than the port already allocated to the given app, thereby preventing access contention.

If no app is registered in the table, the system may assign a given app to a device having the lowest load. This enables the system to achieve substantially equivalent loads among the devices.

If scenario information of a given app is registered in the table, the system may allocate to the given app, a first port that is for an app having scenario information. If no scenario information of a given app is registered in the table, the system may allocate to the given app, a second port that is for an app having no scenario information. The same applies to the storage area. If scenario information is registered in the table, the system may allocate to the given app, a first storage area that is for an app having scenario information. If no scenario information is registered in the table, the system may allocate to the given app, a second storage area that is for an app having no scenario information.

For example, the system regards apps that includes processes that often access the memory and apps that includes processes of copying data between plural devices as an app to be allocated the first port. This enables the system to prevent a state in which all the ports are occupied by apps that do not cause access contention and inter-device data copying. When an app is activated that causes access contention and the device-to-device data copying, the system may allocate an available first port to the app.

When an app having scenario information is activated, the system may determine whether an available first port is present and, if an available port is not present, may allocate a second port to the app having scenario information. This enables the system to start the execution of the app having scenario information even when all of the first ports are in use.

The system may notify the address translator of an address translation table that performs translation between the logical address accessed by the device and the physical address of the storage area. Hence, the given app can be executed constantly at the same logical address irrespective of the memory area in which the storage area is set.

When the app allocated to the given device is switched, the system may acquire from the table, identification information of a port corresponding to the app after the switch and notify the port connector in the memory controller. This enables the system to prevent the copying process with respect to the app after the switch.

When the app allocated to the given device ends, the system may delete the port identification information and the storage area address registered in the table for the app. This enables the system to allocate a once-used port and storage area as a port and a storage area to be used by another app.

During the execution of the given app, the system may record the memory access count and the device use count and register the given app scenario information into the table based on the access count, the use count, and the given app processing load. Hence, even if the app has no scenario information, if access contention or the device-to-device copying process occurs, the system can allocate an occupied port from the next activation, thereby preventing access contention or the device-to-device copying process. For example, the system is applicable to an app, etc. downloaded via a network by the user.

The number of ports of the memory controller according to the present embodiment is at most the number of the devices. The system of the present embodiment can simultaneously execute an equal number of apps to the number of the ports of the memory controller. Consequent to the software-based memory control, the memory control method of the present embodiment can suppress the production costs. The technique of Patent Document 1 brought about increased production costs due to the mounting of the plural memory controllers. Consequent to preventing memory access contention, the system of the present embodiment can expect an improvement in performance on the order of 50%, as compared with the conventional system.

The memory control method described in the present embodiment may be implemented by executing a prepared program on a computer such as a personal computer and a workstation. The program is stored on a computer-readable recording medium such as a hard disk, a flexible disk, a CD-ROM, an MO, and a DVD, read out from the computer-readable medium, and executed by the computer. The program may be distributed through a network such as the Internet.

According to an aspect of the present invention access contention among plural devices with respect to memory can be prevented.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory control method for a system including a memory having a plurality of ports, a plurality of devices, and a port connector that controls connections between the plurality of devices and a plurality of port, the method comprising:
    assigning, based on a table for enregistering an allocated device that executes a first process of a plurality of processes jointly operated in a pipeline manner in a first application, the first process of the plurality of processes jointly operated in the pipeline manner in the first application to the allocated device registered to execute the first process;
    notifying the port connector of identification information of a port of the plurality of ports of the memory used by the plurality of processes jointly operated in the pipeline manner in the first application;
    enregistering the identification information of the port into the table;
    allocating to the port a storage area used by the plurality of processes jointly operated in the pipeline manner in the first application; and
    enregistering an address of the allocated storage area into the table.

2. The memory control method according to claim 1, wherein
    the assigning includes assigning the first application to a device having a load that is lowest, when the allocated device that is to execute the first process in the first application is not registered in the table.

3. The memory control method according to claim 1, wherein
    the plurality of ports of the memory include a first port allocated for the first application for which an allocated device is registered in the table, and a second port allocated for the first application for which no allocated device is registered in the table.

4. The memory control method according to claim 1, further comprising:
    determining whether a first port of the plurality of ports not in use is present, wherein
    the notifying, when the first port not in use is determined to be present, includes notifying the port connector of the first port, and
    the notifying, when the first port not in use is determined to not be present, includes notifying the port connector of a second port.

5. The memory control method according to claim 1, wherein
    the notifying includes notifying an address translator of an address translation table that performs translation between an address accessed by the allocated device and an address of the storage area.

6. The memory control method according to claim 1, further comprising:
    acquiring, from the table and when the first application is switched to a second application, identification information of a port of the plurality of ports corresponding to the second application, wherein the notifying includes notifying the port connector of the port of the plurality of ports corresponding to the second application.

7. The memory control method according to claim 1, further comprising:

deleting from the table and when the first process in the first application ends, the identification information of the port and the address of the allocated storage area.

8. The memory control method according to claim 1, wherein the assigning, when the first process in the first application ends and a second process subsequent to the first process is registered in the table, assigning the second process to an allocated device corresponding to the second process based on the table.

9. The memory control method according to claim 1, further comprising:

recording an access count to the memory and a use count of the allocated device during execution of the plurality of processes jointly operated in the pipeline manner in the first application; and determining based on the access count, the use count, and processing load of the first application, whether to register the first application into the table.

10. A system comprising:

a table for enregistering an allocated device that is to execute a process of a plurality of processes jointly operated in a pipeline manner in an application;

a port connector that is notified of identification information of a port of memory, where the port to be used between the memory and the allocated device, is based on the table, allocated to the process of the plurality of processes jointly operated in a pipeline manner in the application;

the memory having a plurality of ports and a storage area that is used for the plurality of processes jointly operated in the pipeline manner in the application, where the storage area is allocated to the port that is allocated to the process of the plurality of processes; and an address translation table that performs translation between an address accessed by the allocated device and an address of the allocated storage area.

11. The system according to claim 10, wherein
the table further indicates the identification information of the port and the address of the allocated storage area.

12. The system according to claim 10, wherein
the plurality of ports of the memory include a first port allocated for the first application for which an allocated device is indicated in the table, and a second port allocated for the first application for which no allocated device is indicated in the table.

13. The system according to claim 10, wherein
storage areas of the memory include a first storage area allocated for an application for which an allocated device is indicated in the table, and a second storage area allocated for an application for which no allocated device is indicated in the table.

* * * * *